(12) United States Patent
Kulkarni et al.

(10) Patent No.: US 12,316,358 B2
(45) Date of Patent: May 27, 2025

(54) FREQUENCY-BASED PREDISTORTION SIGNAL GENERATION

(71) Applicant: Qualcomm Incorporated, San Diego, CA (US)

(72) Inventors: Pushkar Bajirao Kulkarni, San Diego, CA (US); Joseph Patrick Burke, San Diego, CA (US); Cong Nguyen, San Diego, CA (US); Sanghoon Kim, San Jose, CA (US); Abdelrahman Mohamed Ahmed Mohamed Ibrahim, San Diego, CA (US); Igor Gutman, Hod HaSharon (IL)

(73) Assignee: QUALCOMM Incorporated, San Diego, CA (US)

( * ) Notice: Subject to any disclaimer, the term of this patent is extended or adjusted under 35 U.S.C. 154(b) by 523 days.

(21) Appl. No.: 17/657,336

(22) Filed: Mar. 30, 2022

(65) Prior Publication Data
US 2023/0318636 A1    Oct. 5, 2023

(51) Int. Cl.
*H04B 1/04*     (2006.01)
*H04B 1/525*    (2015.01)
*H04L 5/00*     (2006.01)

(52) U.S. Cl.
CPC ........... *H04B 1/0458* (2013.01); *H04B 1/525* (2013.01); *H04L 5/0048* (2013.01); *H04B 2001/0425* (2013.01)

(58) Field of Classification Search
CPC .......... H04B 1/02; H04B 1/04; H04B 1/0458; H04B 1/525; H04B 1/62;
(Continued)

(56) References Cited

U.S. PATENT DOCUMENTS

| 5,774,018 | A  | * | 6/1998 | Gianfortune | .......... | H03F 1/3235 |
| | | | | | | 330/149 |
| 7,102,430 | B2 | * | 9/2006 | Johnson | ................ | H03F 1/3247 |
| | | | | | | 330/149 |

(Continued)

FOREIGN PATENT DOCUMENTS

WO    2019117888 A1    6/2019

OTHER PUBLICATIONS

Fu Z., et al., "Frequency-Selective Digital Predistortion for Unwanted Emission Reduction", IEEE Transactions on Communications, IEEE Service Center, Piscataway, NJ, USA, vol. 63, No. 1, Jan. 1, 2015, pp. 254-267, XP011569870, 15 Pages paragraph [0001] -paragraph [0VII], figures 1-13, Figures 1-13, Abstract, p. 254, Right-hand Column, Line 1—p. 266, Left-hand Column, Line 10.

(Continued)

*Primary Examiner* — Quochien B Vuong
(74) *Attorney, Agent, or Firm* — Loza & Loza LLP

(57) ABSTRACT

An apparatus is disclosed for frequency-based predistortion signal generation. In an example aspect, the apparatus includes a predistortion linearizer circuit configured to be coupled to an input of an amplifier. The amplifier has non-linearities associated with multiple frequencies. The multiple frequencies include a first subset of frequencies and a second subset of frequencies. The predistortion linearizer circuit is also configured to accept an input signal. The predistortion linearizer circuit is additionally configured to generate, based on the input signal, a compensation signal to attenuate the non-linearities existing within the first subset of frequencies more than the non-linearities existing within the second subset of frequencies. The predistortion linearizer circuit is further configured to generate a pre-distorted signal based on the input signal and the compensation signal.

42 Claims, 15 Drawing Sheets

(58) Field of Classification Search
CPC .... H04B 2001/0408; H04B 2001/0425; H04L 5/003; H04L 5/0048
See application file for complete search history.

(56) References Cited

U.S. PATENT DOCUMENTS

| | | | |
|---|---|---|---|
| 8,380,144 B1* | 2/2013 | Bai | H04B 1/0475 |
| | | | 375/296 |
| 9,002,302 B1 | 4/2015 | Qian et al. | |
| 9,252,718 B2* | 2/2016 | Laporte | H04B 1/0475 |
| 2005/0189990 A1 | 9/2005 | Mizuta et al. | |
| 2012/0200355 A1 | 8/2012 | Braithwaite | |
| 2013/0200950 A1 | 8/2013 | Bai | |
| 2017/0317913 A1* | 11/2017 | Kim | H04L 43/50 |
| 2020/0119755 A1* | 4/2020 | Mahmood | H04B 1/0475 |
| 2021/0013844 A1 | 1/2021 | Choi et al. | |

OTHER PUBLICATIONS

International Search Report and Written Opinion—PCT/US2023/063228—ISA/EPO—Jun. 14, 2023, 16 pages.

\* cited by examiner

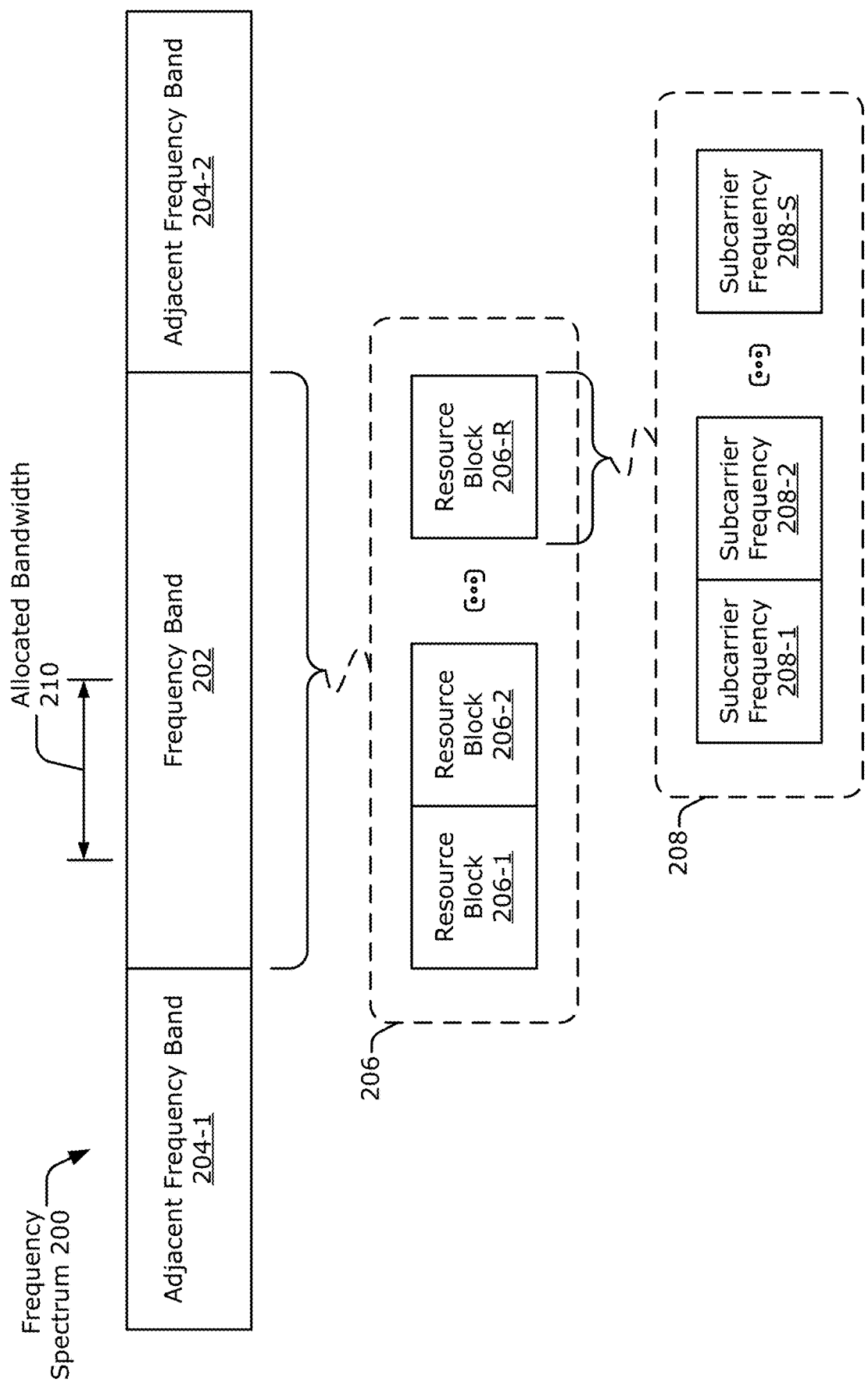

800

Generate, based on the input signal, a compensation signal to attenuate non-linearities existing within a first subset of frequencies more than other non-linearities existing within a second subset of frequencies, the non-linearities and the other non-linearities associated with an amplifier
802

Generate a pre-distorted signal based on the input signal and the compensation signal
804

Pass the pre-distorted signal to an input of the amplifier
806

FIG. 8

FREQUENCY-BASED PREDISTORTION SIGNAL GENERATION

TECHNICAL FIELD

This disclosure relates generally to wireless transceivers and, more specifically, to a predistortion linearizer circuit that performs predistortion signal generation on a frequency basis.

BACKGROUND

Electronic devices use radio-frequency (RF) signals to communicate information. These radio-frequency signals enable users to talk with friends, download information, share pictures, remotely control household devices, receive global positioning information, and so forth. The radio-frequency signals are analog signals, which can physically travel between electronic devices and transfer digitally encoded communication data. Over longer distances, it may be challenging to distinguish the radio-frequency signals from background noise. To address this issue, some electronic devices use an amplifier, such as a power amplifier, to amplify the radio-frequency signal. In this way, the electronic device can communicate with other devices over farther distances.

In some situations, the amplifier can consume a significant amount of power, which can limit mobile operation of the electronic device. It can therefore be desirable to operate the amplifier close to saturation for improved efficiency and thereby extend battery life. Operating the amplifier close to saturation, however, can generate non-linearities (e.g., distortion products) that negatively alter a signal to be transmitted. In some cases, amplitudes of these non-linearities can violate linearity specifications. Consequently, it can be challenging to operate an amplifier in a manner that conserves power to extend mobile operation without violating linearity specifications.

SUMMARY

An apparatus is disclosed that implements frequency-based predistortion signal generation. A predistortion linearizer circuit compensates for non-linearities within an amplifier by generating a pre-distorted signal prior to amplification. The pre-distorted signal includes non-linear components that are designed to attenuate at least some of the non-linearities generated by the amplifier. By at least partially canceling the effects of the non-linearities of the amplifier using the pre-distorted signal, an output of the amplifier can be more linear, which provides superior transmission performance in some environments.

With frequency-based predistortion signal generation, the predistortion linearizer circuit shapes an amplitude of the pre-distorted signal in various ways across a frequency spectrum. In particular, amplitudes of the non-linear components associated with a first subset of frequencies can be adjusted separately from amplitudes of other non-linear components associated with a second subset of frequencies. In this way, the non-linear components of the pre-distorted signal can attenuate different non-linearities of the amplifier by different amounts based on frequency. This provides the predistortion linearizer circuit the flexibility to dynamically tailor the pre-distorted signal such that one or more linearity specifications are met. Example linearity specifications include an error vector magnitude (EVM) target, an in-band emissions (IBE) target, and/or an adjacent channel leakage ratio (ACLR) target. As a result, the predistortion linearizer circuit can ensure that one or more of the linearity specifications are met in situations in which the amplifier operates near saturation for improved efficiency.

In an example aspect, an apparatus is disclosed. The apparatus includes a predistortion linearizer circuit configured to be coupled to an input of an amplifier. The amplifier has non-linearities associated with multiple frequencies. The multiple frequencies include a first subset of frequencies and a second subset of frequencies. The predistortion linearizer circuit is also configured to accept an input signal. The predistortion linearizer circuit is additionally configured to generate, based on the input signal, a compensation signal to attenuate the non-linearities existing within the first subset of frequencies more than the non-linearities existing within the second subset of frequencies. The predistortion linearizer circuit is further configured to generate a pre-distorted signal based on the input signal and the compensation signal.

In an example aspect, an apparatus is disclosed. The apparatus includes amplification means for amplifying a pre-distorted signal. The amplification means has non-linearities associated with multiple frequencies. The multiple frequencies include a first subset of frequencies and a second subset of frequencies. The apparatus also includes predistortion means for attenuating the non-linearities existing within the first subset of the multiple frequencies more than the non-linearities existing within the second subset of the multiple frequencies to produce the pre-distorted signal.

In an example aspect, a method of performing frequency-based predistortion signal generation is disclosed. The method includes generating, based on an input signal, a compensation signal to attenuate non-linearities existing within a first subset of frequencies more than other non-linearities existing within a second subset of frequencies. The non-linearities and the other non-linearities are associated with an amplifier. The method also includes generating a pre-distorted signal based on the input signal and the compensation signal. The method further includes passing the pre-distorted signal to an input of the amplifier.

In an example aspect, an apparatus is disclosed. The apparatus includes a predistortion linearizer circuit operably coupled to an input of an amplifier. The amplifier has non-linearities associated with multiple frequencies. The multiple frequencies include a first subset of frequencies and a second subset of frequencies. The predistortion linearizer circuit is configured to attenuate the non-linearities existing within out-of-band frequencies by a greater amount relative to the non-linearities existing within in-band frequencies.

In an example aspect, at least one computer-readable storage medium is disclosed. The computer-readable storage medium includes computer-executable instructions that, responsive to execution by a processor, implement a predistortion linearizer circuit configured to accept an input signal. The predistortion linearizer circuit is also configured to generate, based on the input signal, a compensation signal having an amplitude with a shape that differs between a first subset of frequencies and a second subset of frequencies. The predistortion linearizer circuit is additionally configured to generate a pre-distorted signal based on the input signal and the compensation signal.

In an example aspect, an apparatus is disclosed. The apparatus includes a radio-frequency front-end circuit and a predistortion linearizer. The radio-frequency front-end circuit is configured to be coupled to an antenna and includes an amplifier. The amplifier is configured to generate, based on a pre-distorted signal, an amplified signal having non-linearities within out-of-band frequencies attenuated by a greater amount than non-linearities within in-band frequencies. The predistortion linearizer circuit is operably coupled to an input of the amplifier and configured to generate the pre-distorted signal.

BRIEF DESCRIPTION OF DRAWINGS

FIG. 2-1 illustrates example aspects of a frequency spectrum that are associated with frequency-based predistortion signal generation.

FIG. 2-2 illustrates an example allocated bandwidth for applying frequency-based predistortion signal generation.

FIG. 2-3 illustrates another example allocated bandwidth for applying frequency-based predistortion signal generation.

FIG. 2-4 illustrates yet another example allocated bandwidth for applying frequency-based predistortion signal generation.

FIG. 2-5 illustrates another example allocated bandwidth for applying frequency-based predistortion signal generation.

FIG. 3-1 illustrates examples of an antenna and a wireless transceiver for implementing frequency-based predistortion signal generation.

FIG. 3-2 illustrates examples of a modem, a predistortion linearizer circuit, a radio-frequency front-end circuit, and an antenna for implementing frequency-based predistortion signal generation.

FIG. 4 illustrates an example weight estimation circuit of a predistortion linearizer circuit for implementing frequency-based predistortion signal generation.

FIG. 5 illustrates an example waveform generation circuit of a predistortion linearizer circuit for implementing frequency-based predistortion signal generation.

FIG. 6-1 illustrates example waveform-shaping functions for implementing frequency-based predistortion signal generation.

FIG. 6-2 illustrates other example waveform-shaping functions for implementing frequency-based predistortion signal generation.

FIG. 7-1 illustrates example elements of an amplified signal.

FIG. 7-2 illustrates an example graph showing a performance comparison between techniques that utilize and techniques that do not utilize frequency-based predistortion signal generation.

FIG. 8 is a flow diagram illustrating an example process implementing frequency-based predistortion signal generation.

DETAILED DESCRIPTION

Figure 1:
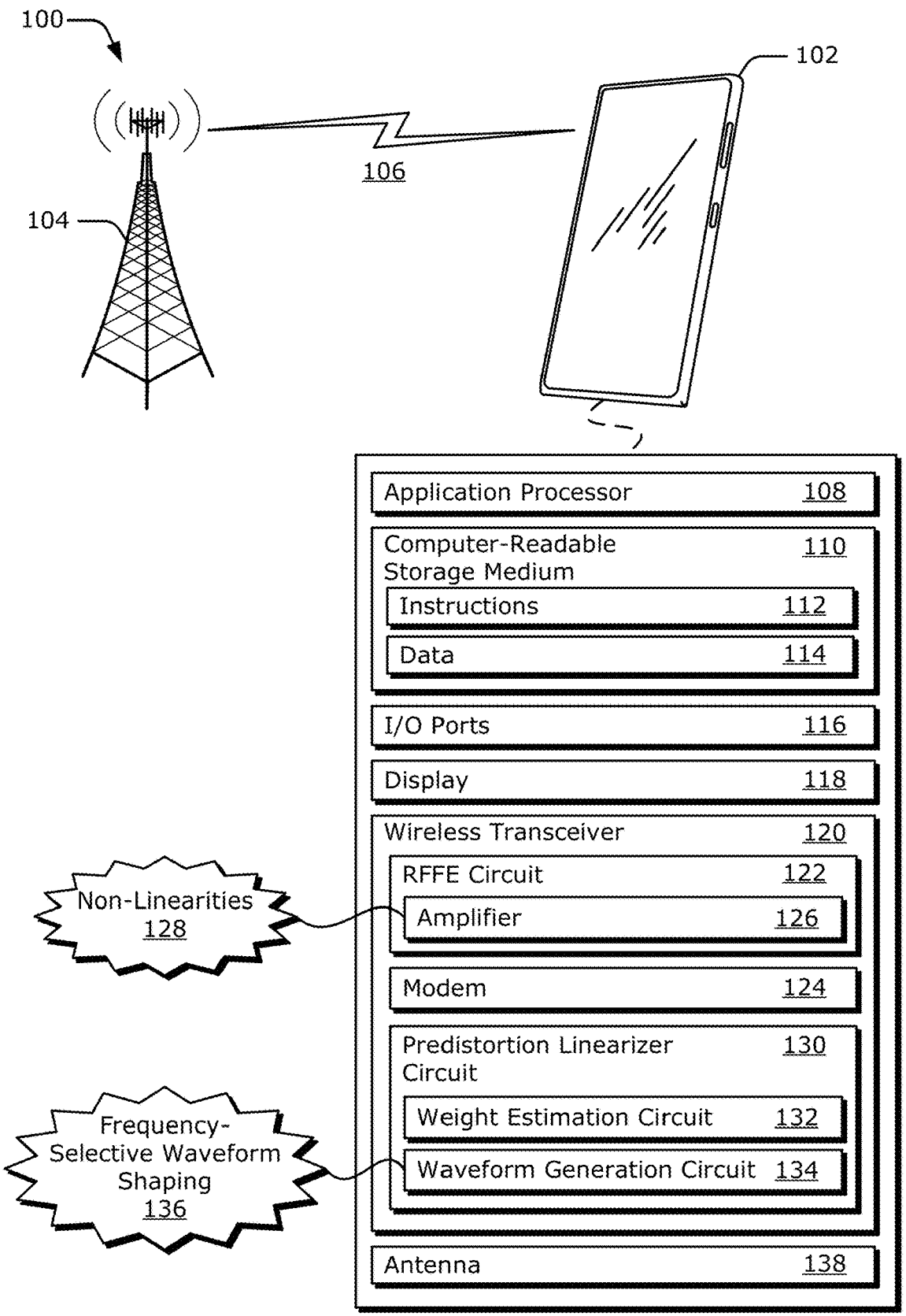
FIG. 1 illustrates an example operating environment for implementing frequency-based predistortion signal generation.

It can be challenging to operate an amplifier, such as a power amplifier, in a manner that conserves power to extend mobile operation without violating linearity specifications. The amplifier, for instance, can be operated close to saturation for improved efficiency. Operating the amplifier close to saturation, however, can generate non-linearities (e.g., distortion products) that negatively alter a signal to be transmitted. In particular, these non-linearities can introduce noise and distortion within the signal's frequency band and/or an adjacent frequency band. In some cases, amplitudes of these non-linearities can violate linearity specifications.

To avoid violating linearity specifications, some techniques operate the amplifier within a linear portion of its operating curve. Furthermore, to accommodate targeted peak-to-average power ratios (PAPRs) of some transmission formats, the operating point of the amplifier is backed off from saturation. On one hand, by backing away from saturation, the operating point of the amplifier accommodates for amplitude and phase fluctuations of an input signal. On the other hand, the amplifier operates at a lower efficiency as compared to operating closer to saturation.

To address these challenges, techniques for implementing frequency-based predistortion signal generation are described herein. A predistortion linearizer circuit compensates for non-linearities within an amplifier by generating a pre-distorted signal prior to amplification. The pre-distorted signal includes non-linear components that are designed to attenuate at least some of the non-linearities generated by the amplifier. By at least partially canceling the effects of the non-linearities of the amplifier using the pre-distorted signal, an output of the amplifier can be more linear, which provides superior transmission performance in some environments.

With frequency-based predistortion signal generation, the predistortion linearizer circuit shapes an amplitude of the pre-distorted signal in various ways across a frequency spectrum. In particular, amplitudes of the non-linear components associated with a first subset of frequencies can be adjusted separately from amplitudes of other non-linear components associated with a second subset of frequencies. In this way, the non-linear components of the pre-distorted signal can attenuate different non-linearities of the amplifier by different amounts based on frequency. The frequencies can include in-band frequencies associated with allocated resource blocks or out-of-band frequencies associated with non-allocated resource blocks or associated with an adjacent frequency band. This provides the predistortion linearizer circuit the flexibility to dynamically tailor the pre-distorted signal such that one or more linearity specifications are met. Example linearity specifications include an error vector magnitude (EVM) target, an in-band emissions (IBE) target, and/or an adjacent channel leakage ratio (ACLR) target. As a result, the predistortion linearizer circuit can ensure that one or more of the linearity specifications are met in situations in which the amplifier operates near saturation for improved efficiency, or in situations in which an amplifier is used which is of a lower quality in terms of having inherent non-linearities also when operated not close to saturation. In general, the techniques for implementing frequency-based predistortion signal generation can compensate for non-linearities in amplifiers regardless of whether the amplifiers operate near saturation or operate substantially far away from saturation.

FIG. 1 illustrates an example environment 100 for frequency-based predistortion signal generation. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device with a wireless interface, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 138. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 138.

The wireless transceiver 120 includes at least one radio-frequency front-end (RFFE) circuit 122 (RFFE circuit 122) and at least one modem 124. The radio-frequency front-end circuit 122 can be implemented using one or more integrated circuits. In general, the radio-frequency front-end circuit 122 conditions signals associated with radio frequencies (e.g., frequencies above 20 kilohertz).

The radio-frequency front-end circuit 122 can include at least one amplifier 126, such as a power amplifier. In this example, the amplifier 126 amplifies radio-frequency signals. Alternatively, the amplifier 126 can be implemented within another integrated circuit of the wireless transceiver 120, such as an intermediate-frequency circuit. In this case, the amplifier 126 amplifies intermediate-frequency signals.

The amplifier 126 can be implemented using one or more transistors, such as an n-channel metal-oxide-semiconductor field-effect transistor (NMOSFET), a p-channel metal-oxide-semiconductor field-effect transistor (PMOSFET), or some combination thereof. The amplifier 126 can optionally operate close to saturation for improved efficiency. In other words, an operating point of the amplifier 126 can be substantially proximate to a saturation point of the amplifier 126. As an example, the operating point of the amplifier 126 can be closer than approximately 7 decibels from the saturation point (e.g., can be approximately 1, 3, 5, or 7 decibels). In general, the term "approximately" can mean that any of the operating points can be within +/−10% of a specified value or less (e.g., within +/−5%, +/−3%, or +/−2% of a specified value). The efficiency of the amplifier 126 can also be referred to as power-added efficiency (PAE). Non-linearities 128 associated with the design and operation of the amplifier 126 can introduce harmonic distortions and/or intermodulation distortions within a communication signal. Left unchecked, these distortions may violate linearity specifications associated with wireless communication standards. The non-linearities 128 can be associated with different frequencies.

Although not explicitly shown, the modem 124 can include at least one processor and CRM, which stores computer-executable instructions (such as the application processor 108, the CRM 110, and the instructions 112). The processor and the CRM can be localized at one module or one integrated circuit chip or can be distributed across multiple modules or chips. Together, the processor and associated instructions can be realized in separate circuitry, fixed logic circuitry, hard-coded logic, and so forth. In some implementations, the modem 124 can include a portion of the CRM 110, can access the CRM 110 to obtain computer-readable instructions, or can include separate CRM. The modem 124 can be implemented as part of the wireless transceiver 120, the application processor 108, a communication processor, a general-purpose processor, some combination thereof, and so forth.

The modem 124 controls the wireless transceiver 120 and enables wireless communication to be performed. The modem 124 can include baseband circuitry to perform high-rate sampling processes that can include analog-to-digital conversion, digital-to-analog conversion, gain correction, skew correction, frequency translation, and so forth. The modem 124 can provide communication data for transmission and process a baseband signal to generate data, which can be provided to other parts of the computing device 102 for wireless communication.

In some implementations, the modem 124 performs envelope tracking (ET) or average power tracking (APT). Using these techniques, the modem 124 adjusts a supply voltage that is provided to the amplifier 126 to improve the efficiency of the amplifier 126 and conserve power within the computing device 102.

The wireless transceiver 120 also includes a predistortion linearizer circuit 130 (e.g., a digital predistortion (DPD) linearizer, a linear adaptive filter, a predistortion filter, or a linearizer). The predistortion linearizer circuit 130 can be implemented within one or more integrated circuits of the wireless transceiver 120. In some implementations, the predistortion linearizer circuit 130 is implemented, at least in part, within the modem 124. In other implementations, the predistortion linearizer circuit 130 is implemented, at least in part, within an integrated circuit of the wireless transceiver, such as a transceiver circuit, as further described with respect to FIG. 3-1.

The predistortion linearizer circuit 130 can also be implemented, at least in part, on an integrated circuit that is separate from another integrated circuit that includes the amplifier 126 (e.g., separate from the radio-frequency front-end circuit 122). Alternatively, the predistortion linearizer circuit 130 and the amplifier 126 can be implemented on a same integrated circuit.

In general, the predistortion linearizer circuit 130 enables the wireless transceiver 120 to meet linearity specifications by compensating for (or neutralizing) at least some of the non-linearities 128 generated by the amplifier 126. In particular, the predistortion linearizer circuit 130 distorts, prior to amplification, a signal in such a way that the predistortion substantially cancels at least a portion of the distortion introduced by the amplifier 126. In this way, an output of the amplifier 126 can be more linear.

The predistortion linearizer circuit 130 includes a weight estimation circuit 132 and a waveform generation circuit 134. The weight estimation circuit 132 measures the non-linearities 128 associated with the amplifier 126 and generates weights that characterize these non-linearities 128. The waveform generation circuit 134 uses the weights to generate a pre-distorted signal. The pre-distorted signal includes non-linear components, which are designed to substantially attenuate at least some of the non-linearities 128 associated with the amplifier 126.

The waveform generation circuit 134 implements, at least in part, frequency-based predistortion signal generation. For example, the waveform generation circuit 134 can perform frequency-based predistortion signal generation by applying frequency-selective waveform shaping 136 to adjust amplitudes of the non-linear components within the pre-distorted signal on a frequency basis. In general, the term "circuit" can represent fixed logic circuitry, a processor executing firmware or software, or a combination thereof.

Consider a frequency spectrum, which includes a first subset of frequencies and a second subset of frequencies. The first subset of frequencies includes some of the frequencies within the frequency spectrum, and the second subset of frequencies includes other frequencies within the frequency spectrum. In other words, the first subset of frequencies and the second subset of frequencies include different frequencies. The term "subset" can refer to a "proper subset," such that the subset can have fewer items than a set. For example, the subset does have fewer items than the set. This means that the first subset of frequencies does not include all of the frequencies associated with the frequency spectrum (e.g., the first subset of frequencies includes fewer frequencies than the frequency spectrum). Likewise, the second subset of frequencies does not include all of the frequencies associated with the frequency spectrum.

With frequency-selective waveform shaping 136, amplitudes of non-linear components associated with the first subset of frequencies can be adjusted separately from amplitudes of other non-linear components associated with a second subset of frequencies. In this way, the predistortion linearizer circuit 130 can adjust the shape of the pre-distorted signal to attenuate different non-linearities 128 by different amounts based on frequency.

In contrast to some other types of linearizers, the predistortion linearizer circuit 130 has the flexibility to dynamically tailor the shape of the pre-distorted signal to meet particular linearity specifications. For example, as the allocated frequency resources change, the predistortion linearizer circuit 130 can specifically target the non-linearities 128 that impact the ability of the wireless transceiver 120 to meet the error vector magnitude target, the in-band emissions target, and/or the adjacent channel leakage ratio target as appropriate. As such, the predistortion linearizer circuit 130 can ensure that the linearity specifications are met in situations in which the amplifier 126 operates near saturation for improved efficiency as well as in situations in which the amplifier 126 does not operate near saturation. The techniques for frequency-based predistortion signal generation can also be used in conjunction with envelope tracking or average power tracking to further conserve power within the computing device 102. Aspects of the frequency-selective waveform shaping 136 are further described with respect to FIGS. 2-1 to 2-5.

Figure 2:
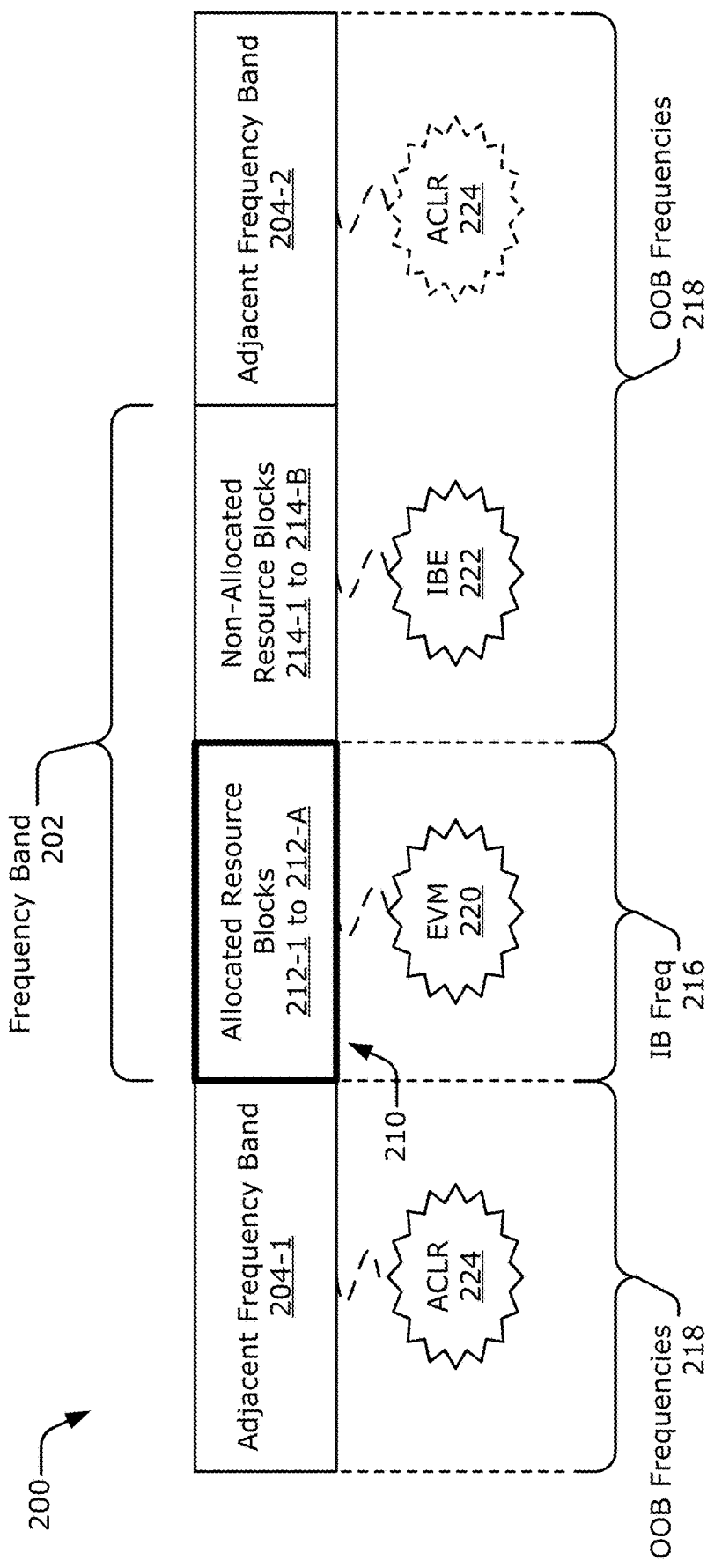

FIG. 2-1 illustrates example frequency bands within a frequency spectrum 200. In particular, the frequency spectrum 200 includes a frequency band 202 and adjacent frequency bands 204-1 and 204-2. The computing device 102 is able to use the frequency band 202 for wireless communication. In the depicted example, the adjacent frequency band 204-1 is depicted on a left-hand side of the frequency band 202 and includes frequencies that are smaller than frequencies associated with the frequency band 202. The adjacent frequency band 204-2 is depicted on a right-hand side of the frequency band 202 and includes frequencies that are larger than the frequencies associated with the frequency band 202.

The frequency band 202 and the adjacent frequency bands 204-1 and 204-2 are each composed of multiple resource blocks 206 (e.g., multiple physical resource blocks (PRBs)). The quantity of resource blocks 206 within the frequency band 202 and the adjacent frequency bands 204-1 or 204-2 can be similar or different. Each resource block 206 can include multiple subcarrier frequencies 208. As an example, the frequency band 202 includes resource blocks 206-1 to 206-R, where R represents a positive integer. The resource block 206-R includes subcarrier frequencies 208-1 to 208-S, where S represents a positive integer. The subcarrier frequencies 208-1 to 208-S can be consecutive subcarrier frequencies.

During wireless communication, at least a portion of the frequency band 202 is allocated to the computing device 102. This portion is represented by the allocated bandwidth 210. As an example, the frequency band 202 can have a total bandwidth that is approximately 100 megahertz (MHz) or more at radio frequencies, and the allocated bandwidth 210 may be between 5 MHz and 100 MHz at radio frequencies. The computing device 102 can transmit radio-frequency signals having frequencies within the allocated bandwidth 210. Additionally, the computing device 102 is to meet specifications that limit an amount of noise that can be generated outside the allocated bandwidth 210. This noise can be caused by at least some of the non-linearities 128 introduced by the amplifier 126 as described above with reference to FIG. 1.

The allocated bandwidth 210 can include different sets of the resource blocks 206. For instance, the allocated bandwidth 210 can include a single resource block or multiple resource blocks. In some cases, the allocated bandwidth 210 can include resource blocks 206 that are at an edge of the frequency band 202. For example, the allocated bandwidth 210 can include resource blocks 206 that are adjacent to the adjacent frequency band 204-1 and/or the adjacent frequency band 204-2. In other cases, the allocated bandwidth 210 can include resource blocks 206 that are within an inner portion of the frequency band 202 (e.g., resource blocks 206 that are not adjacent to the adjacent frequency bands 204-1 and 204-2). Using frequency-selective waveform shaping 136, the predistortion linearizer circuit 130 can ensure that one or more of the linearity specifications are met based on the resource blocks 206 associated with the allocated bandwidth 210. Example resource-block allocations are further described with respect to FIGS. 2-2 to 2-5.

FIG. 2-2 illustrates an example allocated bandwidth 210 for applying frequency-based predistortion signal generation. In this example, the frequency band 202 is shown to include allocated resource blocks 212-1 to 212-A and non-allocated resource blocks 214-1 to 214-B, where A and B represent positive integers that may or may not be equal to each other. The allocated resource blocks 212-1 to 212-A and the non-allocated resource blocks 214-1 to 214-B can form the resource blocks 206-1 to 206-R of FIG. 2-1. The allocated resource blocks 212-1 to 212-A can include the subcarrier frequencies 208 associated with the allocated bandwidth 210. The non-allocated resource blocks 214-1 to 214-B include other subcarrier frequencies 208 that are not associated with the allocated bandwidth 210.

In general, the frequencies included within the allocated resource blocks 212-1 to 212-A can be referred to as in-band (IB) frequencies 216 (IB frequencies 216). Also, the frequencies included within the adjacent frequency bands 204-1 and 204-2 and the non-allocated resource blocks 214-1 to 214-B can be referred to as out-of-band (OOB) frequencies 218 (OOB frequencies 218).

As shown in FIG. 2-2, the allocated resource blocks 212-1 to 212-A are on a left edge of the frequency band 202. As such, the allocated resource blocks 212-1 to 212-A are adjacent to the adjacent frequency band 204-1 in this example. The non-allocated resource blocks 214-1 to 214-B exist between the allocated resource blocks 212-1 to 212-A and the adjacent frequency band 204-2. As such, the allocated resource blocks 212-1 to 212-A are not adjacent to the adjacent frequency band 204-2 in this example.

During wireless communication, the amplifier 126 can introduce non-linearities 128 across the frequency spectrum 200. After filtering a signal that is amplified by the amplifier 126, the non-linearities 128 with frequencies that are within or proximate to the allocated resource blocks 212-1 to 212-A can have higher amplitudes than the non-linearities 128 with frequencies that are farther away from the allocated resource blocks 212-1 to 212-A. Based on the allocated bandwidth 210 being on the left edge of the frequency band 202, the non-linearities 128 within at least a portion of the allocated resource blocks 212-1 to 212-A, the adjacent frequency band 204-1, and/or the non-allocated resource blocks 214-1 to 214-B can make it challenging to meet corresponding linearity specifications.

For example, the non-linearities 128 within the allocated resource blocks 212-1 to 212-A can make it challenging to satisfy an error vector magnitude target 220 (EVM 220). The non-linearities 128 within the non-allocated resource blocks 214-1 to 214-B can make it challenging to satisfy an in-band emissions target 222 (IBE 222). The non-linearities 128 within the adjacent frequency band 204-1 can make it challenging to meet an adjacent channel leakage ratio target 224 (ACLR 224). If a bandwidth of the non-allocated resource blocks 214-1 to 214-B is sufficiently small, the non-linearities 128 within the adjacent frequency band 204-2 can also make it challenging to satisfy the adjacent channel leakage ratio target 224.

Figures 2, 3:
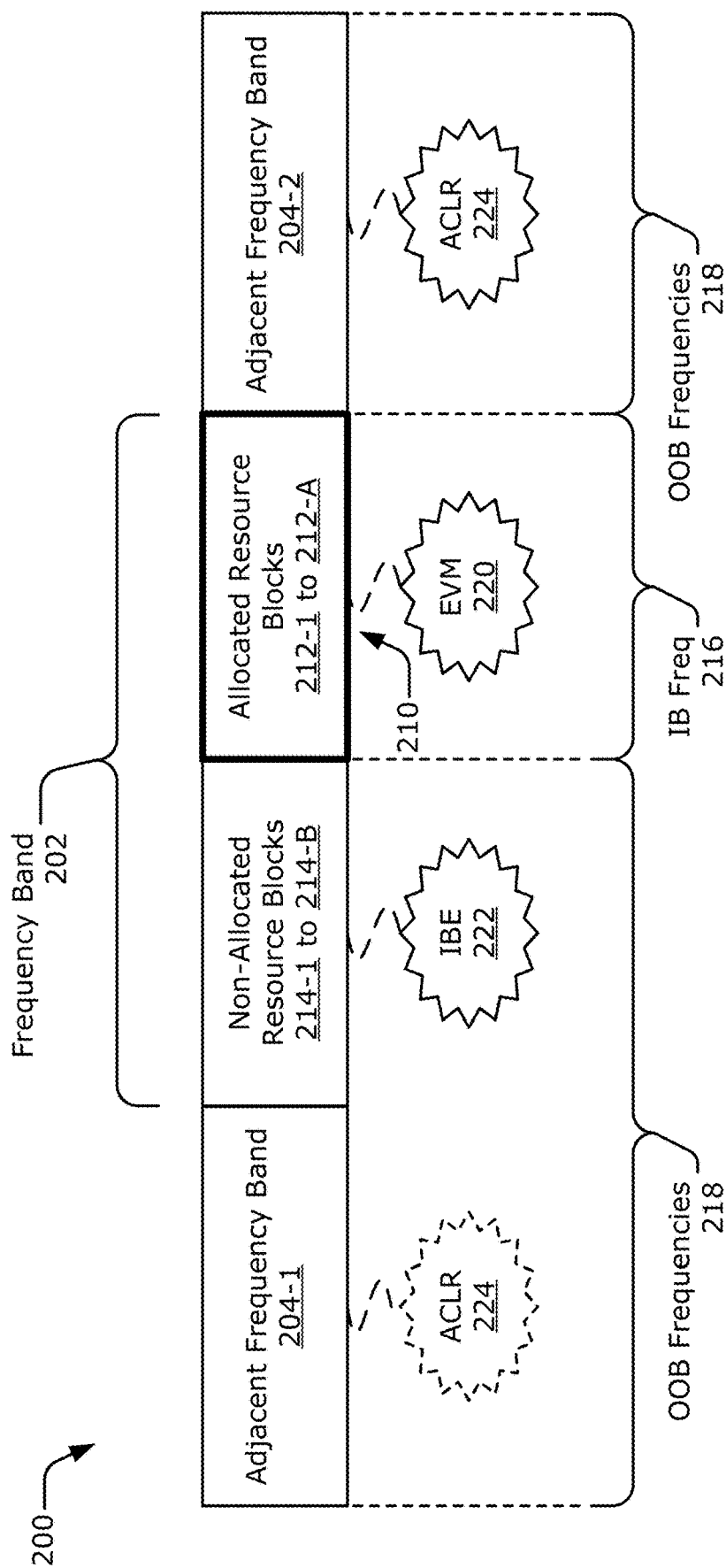

FIG. 2-3 illustrates another example allocated bandwidth 210 for applying frequency-based predistortion signal generation. The frequency spectrum 200 of FIG. 2-3 is similar to the frequency spectrum 200 of FIG. 2-2, except the non-allocated resource blocks 214-1 to 214-B have a lower frequency than the allocated resource blocks 212-1 to 212-A. In particular, the allocated resource blocks 212-1 to 212-A are on a right edge of the frequency band 202. As such, the allocated resource blocks 212-1 to 212-A are adjacent to the adjacent frequency band 204-2 in this example. The non-allocated resource blocks 214-1 to 214-B exist between the allocated resource blocks 212-1 to 212-A and the adjacent frequency band 204-1. As such, the allocated resource blocks 212-1 to 212-A are not adjacent to the adjacent frequency band 204-1 in this example.

During wireless communication, the amplifier 126 can introduce non-linearities 128 across the frequency spectrum 200. After filtering a signal that is amplified by the amplifier 126, the non-linearities 128 with frequencies that are within or proximate to the allocated resource blocks 212-1 to 212-A can have higher amplitudes than the non-linearities 128 with frequencies that are farther away from the allocated resource blocks 212-1 to 212-A. Based on the allocated bandwidth 210 being on the right edge of the frequency band 202, the non-linearities 128 within at least a portion of the allocated resource blocks 212-1 to 212-A, the adjacent frequency band 204-2, and/or the non-allocated resource blocks 214-1 to 214-B can make it challenging to meet corresponding linearity specifications.

For example, the non-linearities 128 within the allocated resource blocks 212-1 to 212-A can make it challenging to satisfy an error vector magnitude target 220 (EVM 220). The non-linearities 128 within the non-allocated resource blocks 214-1 to 214-B can make it challenging to satisfy an in-band emissions target 222 (IBE 222). The non-linearities 128 within the adjacent frequency band 204-2 can make it challenging to meet an adjacent channel leakage ratio target 224 (ACLR 224). If a bandwidth of the non-allocated resource blocks 214-1 to 214-B is sufficiently small, the non-linearities 128 within the adjacent frequency band 204-1 can also make it challenging to satisfy the adjacent channel leakage ratio target 224.

Figures 2, 3, 4:
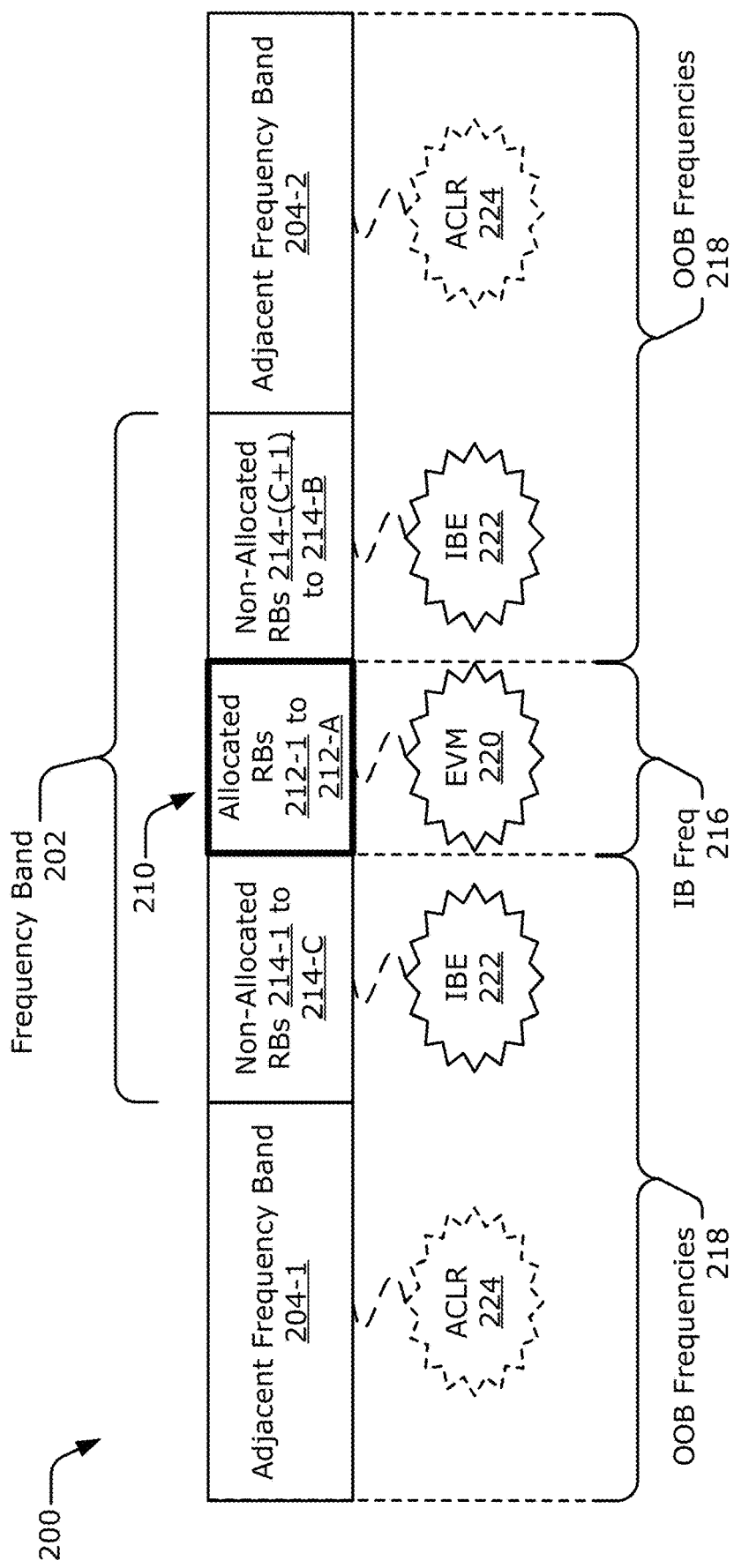

FIG. 2-4 illustrates yet another example allocated bandwidth 210 for applying frequency-based predistortion signal generation. In this example, the frequency band 202 is shown to include the allocated resource blocks 212-1 to 212-A, non-allocated resource blocks 214-1 to 214-C, and non-allocated resource blocks 214-(C+1) to 214-B, where C represents a positive integer that is less than B.

While the allocated bandwidth 210 of FIG. 2-2 or 2-3 exists at an edge of the frequency band 202, the allocated bandwidth 210 of FIG. 2-4 exists in the inner portion of the frequency band 202 such that the allocated resource blocks 212-1 to 212-A are not adjacent to either of the adjacent frequency bands 204-1 and 204-2. In this example, the non-allocated resource blocks 214-1 to 214-C exist between the allocated resource blocks 212-1 to 212-A and the adjacent frequency band 204-1. Also, the non-allocated resource blocks 214-(C+1) to 214-B exist between the allocated resource blocks 212-1 to 212-A and the adjacent frequency band 204-2.

Based on the allocated bandwidth 210 being in the inner portion of the frequency band 202, the non-linearities 128 existing within at least a portion of the allocated resource blocks 212-1 to 212-A, the non-allocated resource blocks 214-1 to 214-C, and/or the non-allocated resource blocks 214-(C+1) to 214-B can make it challenging to meet the error vector magnitude target 220 and/or the in-band emissions target 222. If bandwidths of the non-allocated resource blocks 214-1 to 214-C and/or 214-(C+1) to 214-B are sufficiently small, the non-linearities 128 within the adjacent frequency band 204-1 and/or 204-2 can also make it challenging to satisfy the adjacent channel leakage ratio target 224.

FIG. 2-5 illustrates yet another example allocated bandwidth 210 for applying frequency-based predistortion signal generation. In this example, the frequency band 202 is shown to include the allocated resource blocks 212-1 to 212-A. While the allocated bandwidths 210 of FIGS. 2-2 to 2-4 represent different subsets of consecutive subcarrier frequencies 208 within the frequency band 202, the allocated bandwidth 210 of FIG. 2-5 encompasses the entire frequency band 202. As a result, the allocated resource blocks 212-1 to 212-A are adjacent to both of the adjacent frequency bands 204-1 and 204-2 in this example.

Based on the allocated bandwidth 210 existing at both edges of the frequency band 202, the non-linearities 128 existing within at least a portion of the allocated resource blocks 212-1 to 212-A, the adjacent frequency band 204-1, and/or the adjacent frequency band 204-2 can make it challenging to meet the error vector magnitude target 220 and/or the adjacent channel leakage ratio target 224.

To meet the linearity specifications for the allocated bandwidths 210 described in FIGS. 2-2 to 2-5, the predistortion linearizer circuit 130 can use frequency-based predistortion signal generation to attenuate the non-linearities 128 across the frequency spectrum 200 by appropriate amounts on a frequency-selective basis. Consider a first situation in which the non-linearities 128 of the amplifier 126 do not cause the computing device 102 to violate a first linearity specification, such as the error vector magnitude target 220. As such, the first linearity specification can be readily satisfied. However, the non-linearities 128 of the amplifier 126 significantly impact at least one second linearity specification, such as the in-band emissions target 222 and/or the adjacent channel leakage ratio target 224. Without the techniques of frequency-based predistortion signal generation, the computing device 102 can violate the second linearity specification.

To address this, the predistortion linearizer circuit 130 applies frequency-selective waveform shaping 136 to cause the non-linearities 128 existing within the frequencies associated with the second linearity specification (e.g., at least a portion of the out-of-band frequencies 218) to be attenuated by a larger amount than the non-linearities 128 existing within the frequencies associated with the first linearity specification (e.g., the in-band frequencies 216). By significantly attenuating the non-linearities 128 associated with the second linearity specification, the predistortion linearizer circuit 130 can enable the computing device 102 to satisfy the second linearity specification.

Also, by either leaving the non-linearities 128 existing within the in-band frequencies 216 or attenuating the non-linearities 128 of the in-band frequencies 216 less than other non-linearities in other frequency ranges, the predistortion linearizer circuit 130 can avoid significantly increasing the peak-to-average power ratio of the pre-distorted signal. By addressing the non-linearities 128 within the out-of-band frequencies while limiting expansion of the peak-to-average power ratio, the predistortion linearizer circuit 130 can enable the amplifier 126 to operate near saturation for improved efficiency.

Using these techniques, the amplifier 126 can realize an efficiency improvement of approximately 5% or more relative to other linearizers that do not utilize the techniques of frequency-based predistortion signal generation. In an example implementation, this efficiency improvement can result in a peak DC power savings of approximately hundreds of milliwatts (mW) or more.

In a second situation, the first linearity specification can include the in-band emissions target 222 and/or the adjacent channel leakage ratio target 224, and the second linearity specification can include the error vector magnitude target 220. The predistortion linearizer circuit 130 applies frequency-selective waveform shaping 136 to cause the non-linearities 128 within the frequencies associated with the in-band frequencies 216 to be attenuated by a larger amount than the non-linearities 128 within the out-of-band frequencies 218.

Additionally or alternatively, the predistortion linearizer circuit 130 can cause the non-linearities 128 existing within a subset of the frequency spectrum 200 to be attenuated by different amounts. For instance, the predistortion linearizer circuit 130 can attenuate the non-linearities 128 associated with the second linearity specification by different amounts on a frequency basis. In the case of the first situation, consider the non-linearities 128 within the out-of-band frequencies 218, which can be referred to as out-of-band non-linearities. The predistortion linearizer circuit 130 can attenuate the out-of-band non-linearities that are proximate to the allocated bandwidth 210 by a larger amount than the out-of-band non-linearities that are farther from the allocated bandwidth 210. For the second situation, the predistortion linearizer circuit 130 can attenuate the non-linearities 128 at an edge of the allocated bandwidth 210 by a larger amount than the non-linearities 128 within the inner portion of the allocated bandwidth 210. In another instance, the predistortion linearizer circuit 130 can attenuate the non-linearities 128 existing within the in-band frequencies by different amounts on a frequency basis. An operation of the predistortion linearizer circuit 130 is further described with respect to FIG. 3-1.

FIG. 3-1 illustrates examples of the wireless transceiver 120 and the antenna 138 for implementing frequency-based predistortion signal generation. In the depicted configuration, the wireless transceiver 120 is coupled to the antenna 138. In various implementations, the antenna 138 can be a single antenna or multiple antenna (e.g., multiple antenna elements of an antenna array). The wireless transceiver 120 includes the modem 124, the radio-frequency front-end circuit 122, and optionally one or more transceiver circuits 302. In general, the modem 124, the transceiver circuit 302, and the radio-frequency front-end circuit 122 include components that enable the wireless transceiver 120 to condition signals that are provided to or accepted from the antenna 138.

The transceiver circuit 302 can operate on analog signals in the baseband or intermediate-frequency domain. Example components of the transceiver circuit 302 include a mixer, an amplifier (e.g., a variable gain amplifier), and/or a filter. If the wireless transceiver 120 includes multiple transceiver circuits 302, the transceiver circuits 302 can be implemented as separate integrated circuits.

The radio-frequency front-end circuit 122 is coupled to the antenna 138 and includes the amplifier 126. In some implementations, such as those associated with Wi-Fi®, the radio-frequency front-end circuit 122 can represent a radio-frequency circuit. The radio-frequency circuit is an integrated circuit that includes the amplifier 126 along with other radio-frequency circuitry, such as a phase shifter and/or a mixer.

In a first example implementation, the wireless transceiver 120 represents a direct-conversion or zero-intermediate-frequency transceiver. In this example, the transceiver circuit 302 is configured to provide frequency conversion between baseband frequencies and a radio frequency. The radio-frequency front-end circuit 122 may provide further signal conditioning of the radio frequency signal (e.g., including one or amplifiers (power amplifiers for transmission or LNAs for reception), filters, switching circuits, antenna tuners, and the like). In other implementations the radio-frequency front-end circuit 122 may be optional (or the transceiver circuit 302 is optional and the radio-frequency front-end circuit 122 is coupled to the modem 124 and implemented to provide frequency conversion between baseband frequencies and a radio frequency.

In a second example implementation, the wireless transceiver 120 is a superheterodyne transceiver, which includes one or more transceiver circuits 302 coupled between the modem 124 and the radio-frequency front-end circuit 122. The transceiver circuit 302 can provide frequency conversion between baseband frequencies, intermediate frequencies, and/or radio frequencies. For example, the transceiver circuit 302 can upconvert baseband signals to an intermediate frequency and downconvert intermediate-frequency signals to baseband. In various implementations, the transceiver circuit 302 or the radio-frequency front-end circuit 122 upconvert intermediate signals to a radio frequency and downconvert radio-frequency signals to an intermediate frequency. Various combinations of chips, dies, and or packages may be employed to implement the one or more transceiver circuits 302 and the radio-frequency front-end circuit 122.

The predistortion linearizer circuit 130 can be implemented, at least partially, within the modem 124 or the transceiver circuit 302. In particular, the weight estimation circuit 132 and the waveform generation circuit 134 of the predistortion linearizer circuit 130 can be implemented in the modem 124, the transceiver circuit 302, or some combination thereof.

The wireless transceiver 120 implements a transmitter 304 and a receiver 306, which are distributed through portions of the modem 124, the transceiver circuit 302, and the radio-frequency front-end circuit 122. An operation of the wireless transceiver 120 is further described with the assumption that the wireless transceiver 120 is a superheterodyne transceiver. Along a transmit path of the transmitter 304, which is shown traveling from left to right, the modem 124 generates a baseband signal 308-1. If the modem 124 includes a digital-to-analog converter, the baseband signal 308-1 can be an analog signal. Alternatively, if the transceiver circuit 302 includes the digital-to-analog converter, the baseband signal 308-1 can be a digital signal. The transceiver circuit 302 can upconvert the baseband signal 308-1 to generate an intermediate-frequency (IF) or radio-frequency (RF) signal 310-1 (IF or RF signal 310-1). If the signal 310-1 is an intermediate-frequency signal, the radio-frequency front-end circuit 122 upconverts the signal 310-1 to generate a radio-frequency (RF) signal 312-1 (RF signal 312-1). The amplifier 126 of the radio-frequency front-end circuit 122 amplifies the radio-frequency signal 312-1. The antenna 138 transmits the amplified radio-frequency signal 312-1.

Along a receive path of the receiver 306, which is shown traveling from right to left, the antenna 138 passes a radio-frequency signal 312-2 (RF signal 312-2) to the radio-frequency front-end circuit 122. The radio-frequency front-end circuit 122 can downconvert the radio-frequency signal 312-2 to generate a signal 310-2, which can be an intermediate frequency signal or baseband signal. If the signal 310-2 is an intermediate-frequency signal, the transceiver circuit 302 downconverts the intermediate-frequency signal 310-2 to generate the baseband signal 308-2. The modem 124 processes the baseband signal 308-2. Operations of the predistortion linearizer circuit 130 and the amplifier 126 are further described with respect to FIG. 3-2.

FIG. 3-2 illustrates examples of the modem 124, the predistortion linearizer circuit 130, the radio-frequency front-end circuit 122, and the antenna 138 for frequency-based predistortion signal generation. As described with respect to FIG. 3-1, the predistortion linearizer circuit 130 can be implemented in part within the modem 124 and/or the transceiver circuit 302. In the depicted configuration, the predistortion linearizer circuit 130 is coupled between a part of the modem 124 and the radio-frequency front-end circuit 122, which includes the amplifier 126. In particular, the waveform generation circuit 134 of the predistortion linearizer circuit 130 is coupled between a part of the modem 124 and an input of the amplifier 126. The weight estimation circuit 132 of the predistortion linearizer circuit 130 is coupled to a part of the modem 124, the waveform generation circuit 134, the input of the amplifier 126, and an output of the amplifier 126.

The radio-frequency front-end circuit 122 is also coupled to the antenna 138. Although not shown, the radio-frequency front-end circuit 122 can include a filter (e.g., an acoustic filter), which is coupled between the output of the amplifier 126 and the antenna 138. In some implementations, the radio-frequency front-end circuit 122 can also include other components, such as a mixer, a switch, or a phase shifter.

During operation, the weight estimation circuit 132 provides weights 314-1 to 314-K (e.g., Volterra kernel coefficients) to the waveform generation circuit 134. The variable K represents a positive integer. The weights 314-1 to 314-K characterize at least some of the non-linearities 128 associated with the amplifier 126. The weights 314-1 to 314-K can be represented by complex numbers, which may have real and imaginary components.

In some instances, the weights 314-1 to 314-K are predetermined, and the weight estimation circuit 132 extracts the weights 314-1 to 314-K from the computer-readable storage medium 110. In other instances, the weight estimation circuit 132 updates the weights 314-1 to 314-K during operation. By updating the weights 314-1 to 314-K, the weight estimation circuit 132 can account for changes in the non-linearities 128 of the amplifier 126. Some of these changes can occur as a result of changes in the allocated bandwidth 210, transmission power, and/or temperature.

To initiate weight estimation, the modem 124 can pass a control signal 316 to the weight estimation circuit 132. The control signal 316 triggers the weight estimation circuit 132 to update or re-evaluate at least a portion of the weights 314-1 to 314-K. The weight estimation circuit 132 can pass a report signal 318 to the modem 124 to indicate completion of the weight estimation. In some implementations, the weight estimation circuit 132 monitors the non-linearities 128 of the amplifier 126. If the weight estimation circuit 132 notices significant changes in the non-linearities 128 of the amplifier 126, the weight estimation circuit 132 can use the report signal 318 to request another iteration of weight estimation to update the weights 314-1 to 314-K. The operation of the weight estimation circuit 132 is further described with respect to FIG. 4.

In general, the weight estimation circuit 132 can generate the weights 314-1 to 314-K in a sub-band fashion 326 or a full-band fashion 328. For the sub-band fashion 326, the weight estimation circuit 132 estimates the weights 314-1 to 314-K for a subset of frequencies within the frequency spectrum 200. The subset of frequencies can include the in-band frequencies 216, the out-of-band frequencies 218, or portions thereof. For the full-band fashion 328, the weight estimation circuit 132 estimates the weights 314-1 to 314-K for a substantial portion of the frequency spectrum 200, which can include the frequency band 202 and the adjacent frequency bands 204-1 and 204-2.

Along with the weights 314-1 to 314-K, the waveform generation circuit 134 accepts an input signal 320 from the modem 124. The input signal 320 can represent the baseband signal 308-1 in the analog or digital domain. The waveform generation circuit 134 uses the weights 314-1 to 314-K to distort the input signal 320 and generate the pre-distorted signal 322. The pre-distorted signal 322 includes non-linear components that are tailored to attenuate at least some of the non-linearities 128 associated with the amplifier 126.

While other linearizers operate the waveform generation circuit 134 in the full-band fashion 328, the techniques for frequency-based predistortion signal generation enable the waveform generation circuit 134 to optionally operate in the sub-band fashion 326. In the sub-band fashion 326, the waveform generation circuit 134 can vary the amplitudes of non-linear components associated with different frequencies. In this way, the pre-distorted signal 322 can attenuate different non-linearities 128 associated with the amplifier 126 by different amounts based on frequency. The operation of the waveform generation circuit 134 is further described with respect to FIG. 5.

The amplifier 126 accepts a version of the pre-distorted signal 322. The version of the pre-distorted signal 322 can represent an upconverted version of the pre-distorted signal 322 (e.g., the signal 310-1) or a radio-frequency version of the pre-distorted signal 322 (e.g., the radio-frequency signal 312-1). The amplifier 126 amplifies the pre-distorted signal 322 to generate the amplified signal 324. The antenna 138 accepts the amplified signal 324 from the radio-frequency front-end circuit 122 and transmits the amplified signal 324. An example implementation of the predistortion linearizer circuit 130 is further described with respect to FIGS. 4 and 5.

FIG. 4 illustrates an example weight estimation circuit 132 for frequency-based predistortion signal generation. In the depicted configuration, the weight estimation circuit 132 includes a state expander 402 (e.g., a kernel generator), a weight generator 404, and an error evaluator 406. The state expander 402 is coupled to an input of the amplifier 126. The weight generator 404 is coupled to an output of the state expander 402 and an output of the amplifier 126. The error evaluator 406 is coupled to an output of the state expander 402, the output of the amplifier 126, and an output of the weight generator 404. Although not shown, the weight estimation circuit 132 can additionally include a sampling circuit, which samples signals at the input and the output of the amplifier 126.

During operation, the amplifier 126 accepts an injection signal 408 and amplifies the injection signal 408 to generate the amplified signal 324. The injection signal 408 can be generated by the modem 124 or the transceiver circuit 302. In some cases the injection signal 408 is a calibration signal that can be provided during operation of a calibration mode or initialization mode. In other cases, the injection signal 408 can be a version of a wireless communication signal (e.g., an uplink signal) that is to be transmitted during a mission mode.

The weight estimation circuit 132 samples the injection signal 408 and passes the samples to the state expander 402. As an example, the weight estimation circuit 132 generates N samples, where N represents a positive integer. The state expander 402 generates linear, non-linear, and memory components (e.g., odd-ordered and/or even-ordered components) from the samples of the injection signal 408. The linear component is a first-order component, and the non-linear components can include a second-order component, a third-order component, a fifth-order component, a seventh-order component, and so forth. These separated components form an expanded injection signal 410, which has K×N terms (e.g., K kernels). The state expander 402 passes the expanded injection signal 410 to the weight generator 404.

The weight estimation circuit 132 also samples the amplified signal 324 and passes these samples to the weight generator 404. The weight generator 404 generates weights 314-1 to 314-K based on the expanded injection signal 410 and the samples of the amplified signal 324. In particular, the weight generator 404 determines the weights 314-1 to 314-K that, when applied to the expanded injection signal 410, cause the resulting signal to be substantially similar to the amplified signal 324. In an example implementation, the weight generator 404 can perform least squares estimation to determine the weights 314-1 to 314-K, as described by Equation 1 below:

$$w_k = (X_{in}X_{in}^*)^{-1}X_{in}y^* \qquad \text{Equation 1}$$

where $w_k$ represents the weights 314-1 to 314-K, $X_{in}$ represents the expanded injection signal 410, y represents the amplified signal 324, and "*" represents a Hermitian operator. The weight generator 404 can also normalize the weights 314-1 to 314-K based on the linear component of the expanded injection signal 410. The weight generator 404 passes the weights 314-1 to 314-K to the error evaluator 406.

The error evaluator 406 evaluates an accuracy of the weights 314-1 to 314-K for representing the non-linearities 128 within the amplified signal 324. For example, the error evaluator 406 applies the weights 314-1 to 314-K to the expanded injection signal 410 to generate an estimate of the amplified signal 324. The error evaluator 406 can use techniques, such as normalized mean-square error, to compare the estimate of the amplified signal 324 to the amplified signal 324.

If the estimate of the amplified signal 324 is substantially different than the measured amplified signal 324, the weight estimation circuit 132 can repeat the process described above to iteratively update the weights 314-1 to 314-K until the estimate of the amplified signal 324 is sufficiently similar to the measured amplified signal 324. After the weight estimation circuit 132 performs weight estimation, the weight generator 404 can pass the weights 314-1 to 314-K to the waveform generation circuit 134 (of FIG. 3-2). An operation of the waveform generation circuit 134 is further described with respect to FIG. 5.

Figures 2, 3, 4, 5:
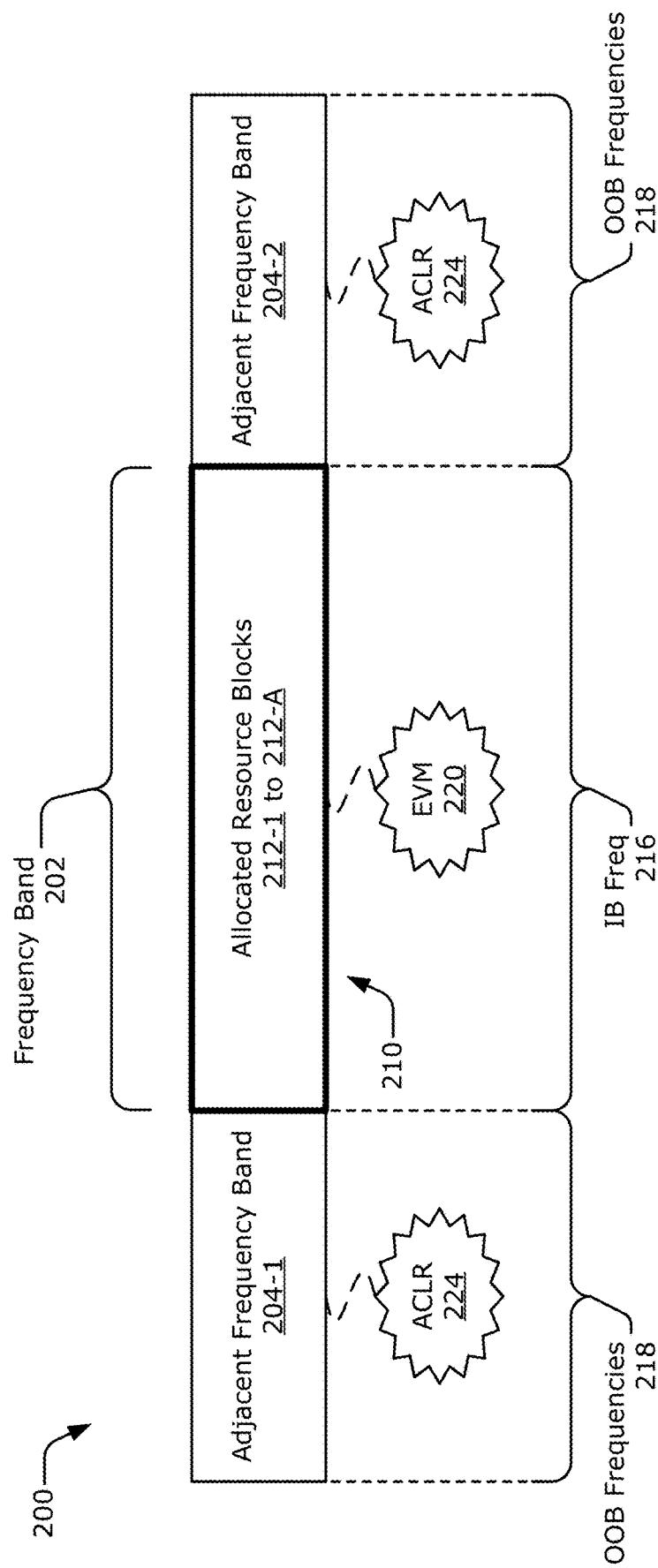
Figures 1, 3:
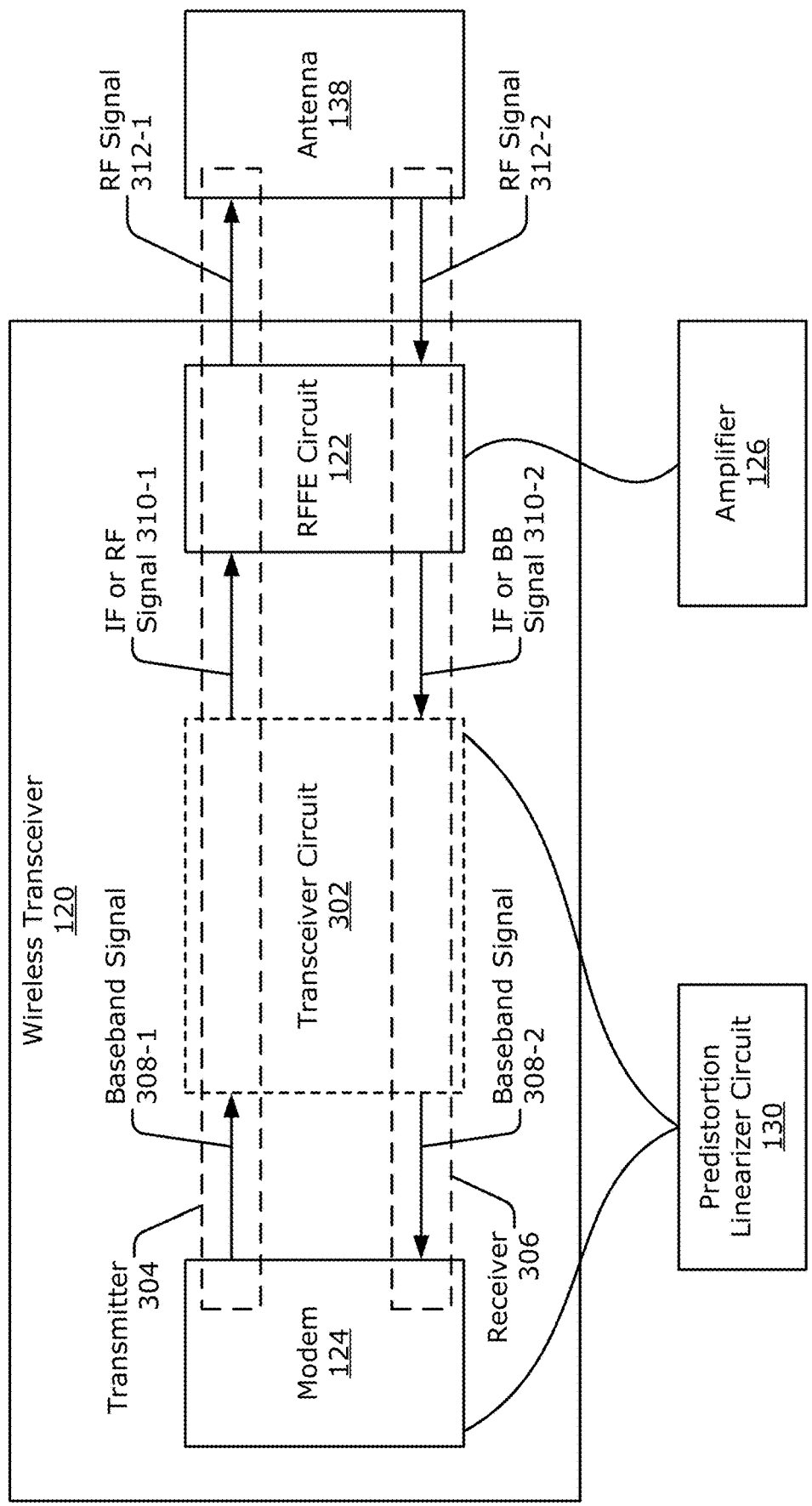
Figures 2, 3:
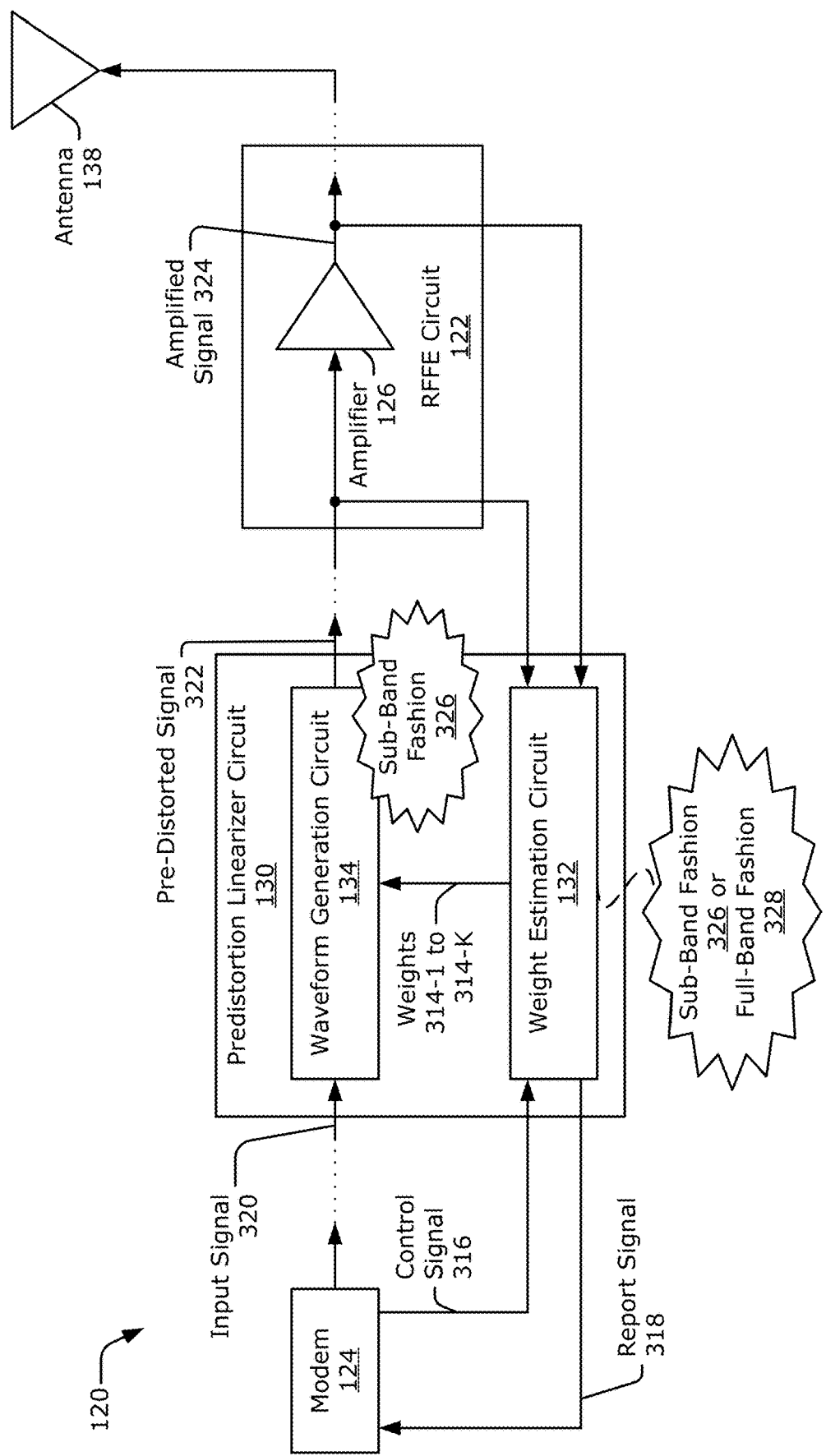
Figure 4:
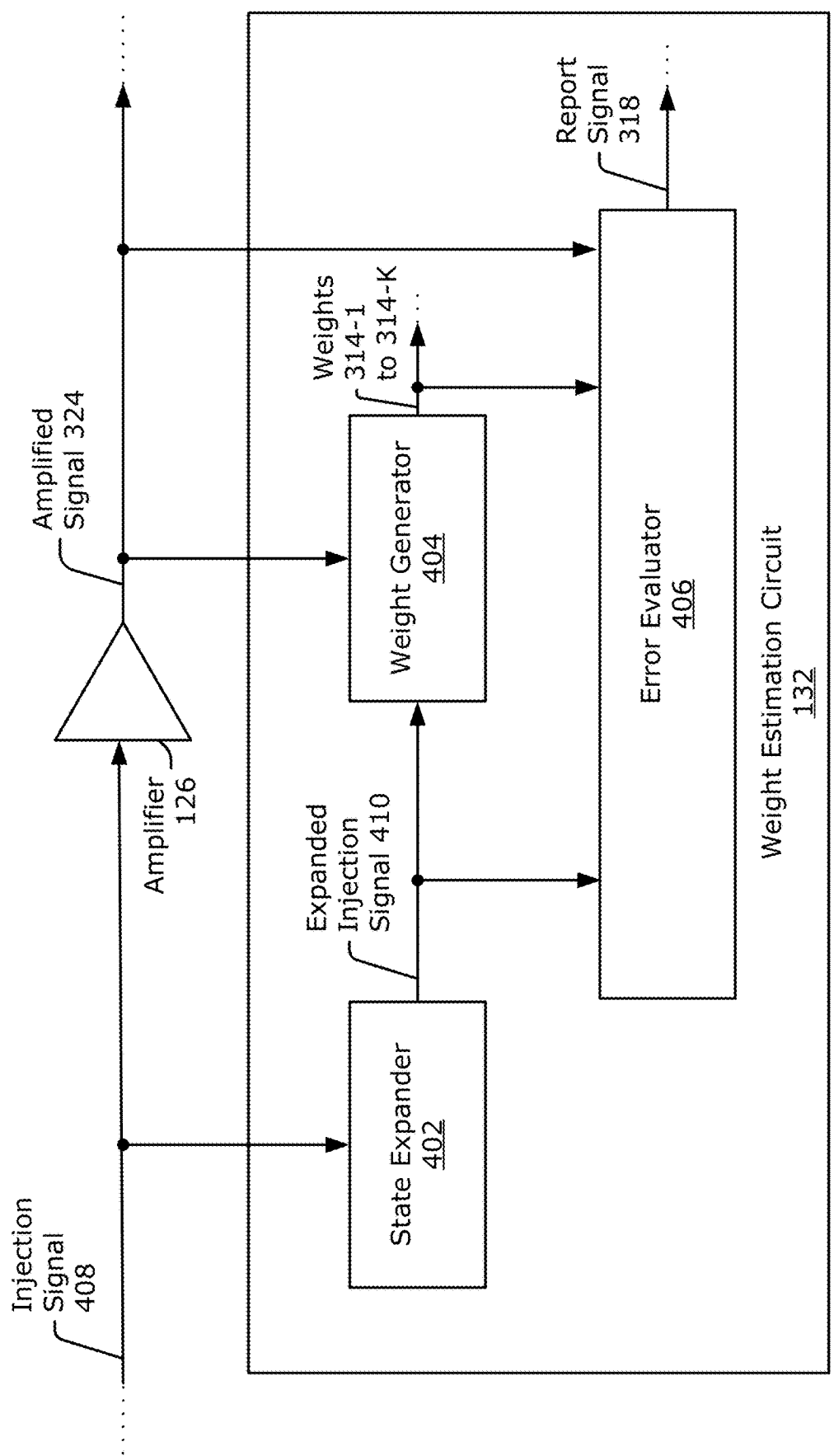
Figure 5:
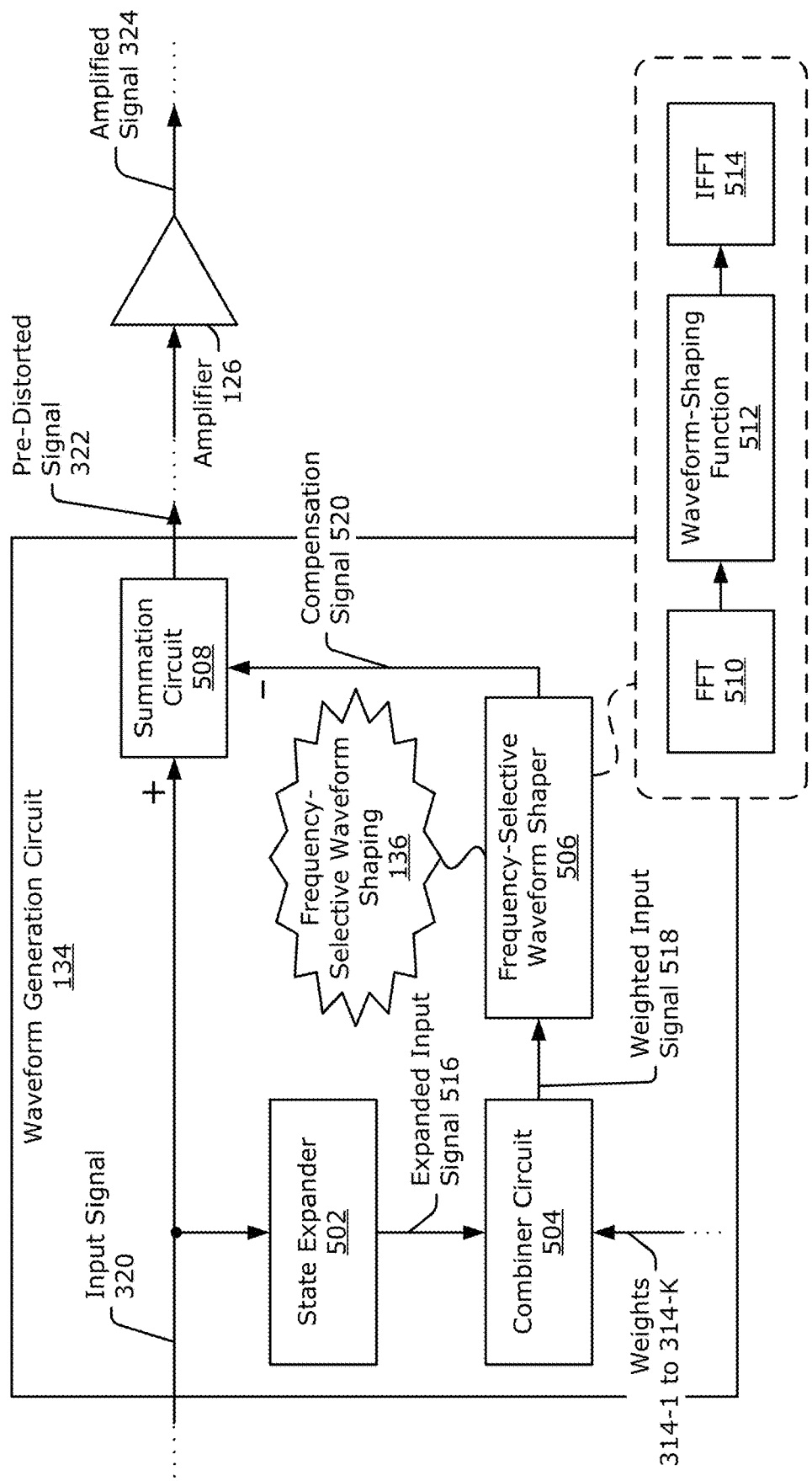

FIG. 5 illustrates an example waveform generation circuit 134 for frequency-based predistortion signal generation. This example implementation of the waveform generation circuit 134 can be implemented by the modem 124 and operate on digital signals. In the depicted configuration, the waveform generation circuit 134 includes a state expander 502, a combiner circuit 504, a frequency-selective waveform shaper 506, and a summation circuit 508. The state expander 502 is coupled to a signal path that exists between the modem 124 and the amplifier 126. The combiner circuit 504 is coupled to an output of the state expander 502 and an output of the weight estimation circuit 132 (of FIG. 3-2). The frequency-selective waveform shaper 506 is coupled to an output of the combiner circuit 504. The summation circuit 508 is coupled to an output of the frequency-selective waveform shaper 506, the modem 124, and the input of the amplifier 126. In general, the summation circuit 508 exists within a signal path that is between the modem 124 and the amplifier 126.

In general, the waveform generation circuit 134 can have a time-domain implementation or a frequency-domain implementation. An example time-domain implementation of the waveform generation circuit 134 can include a time-domain version of the state expander 502. Also, the frequency-selective waveform shaper 506 can perform a fast-Fourier transform 510 to transition from the time domain to a frequency domain, apply a waveform-shaping function 512 in the frequency domain, and perform an inverse fast-Fourier transform 514 to return to the time domain. In contrast, a frequency-domain implementation of the waveform generation circuit 134 can include a frequency-domain version of the state expander 502. Also, the frequency-selective waveform shaper 506 can apply the waveform-shaping function 512 directly.

In another example implementation not shown in FIG. 5, the waveform generation circuit 134 can be implemented within a baseband circuit of the wireless transceiver 120 and operate on analog signals. In this case, the waveform generation circuit 134 can be implemented using a time-domain finite-impulse-response (FIR) filter.

During operation, the waveform generation circuit 134 accepts the input signal 320. The state expander 502 generates linear, non-linear, and memory components (e.g., odd-ordered and/or even-ordered components) from the input signal 320. These separated components form an expanded input signal 516 with K kernels. The state expander 502 passes the expanded input signal 516 to the combiner circuit 504.

The combiner circuit 504 applies the weights 314-1 to 314-K to the expanded input signal 516 to generate a weighted input signal 518. The weighted input signal 518 includes weighted non-linear and memory components. In particular, the combiner circuit 504 multiplies each non-linear and memory component of the expanded input signal 516 with its corresponding weight 314-1 to 314-K. The summation of these multiplication operations results in the generation of the weighted input signal 518.

The frequency-selective waveform shaper 506 performs frequency-selective waveform shaping 136 by applying the waveform-shaping function 512 to the weighted input signal 518. A variety of different types of waveform-shaping functions 512 are further described with respect to FIGS. 6-1 and 6-2. In general, the waveform-shaping function 512 is designed to attenuate different non-linearities 128 associated with different subsets of frequencies by different amounts. In this way, the predistortion linearizer circuit 130 can distort portions of the input signal 320 in a frequency-selective manner. Furthermore, the predistortion linearizer circuit 130 can distort the portions of the input signal 320 by different amounts in order to target non-linearities 128 associated with a particular linearity specification. Using the waveform-shaping function 512, the frequency-selective waveform shaper 506 generates a compensation signal 520 based on the weighted input signal 518.

The summation circuit 508 generates the pre-distorted signal 322 based on the input signal 320 and the compensation signal 520. For example, the summation circuit 508 can subtract the compensation signal 520 from the input signal 320 to generate the pre-distorted signal 322. Aspects of frequency-selective waveform shaping 136 are further described with respect to FIGS. 6-1 and 6-2.

Figures 1, 6:
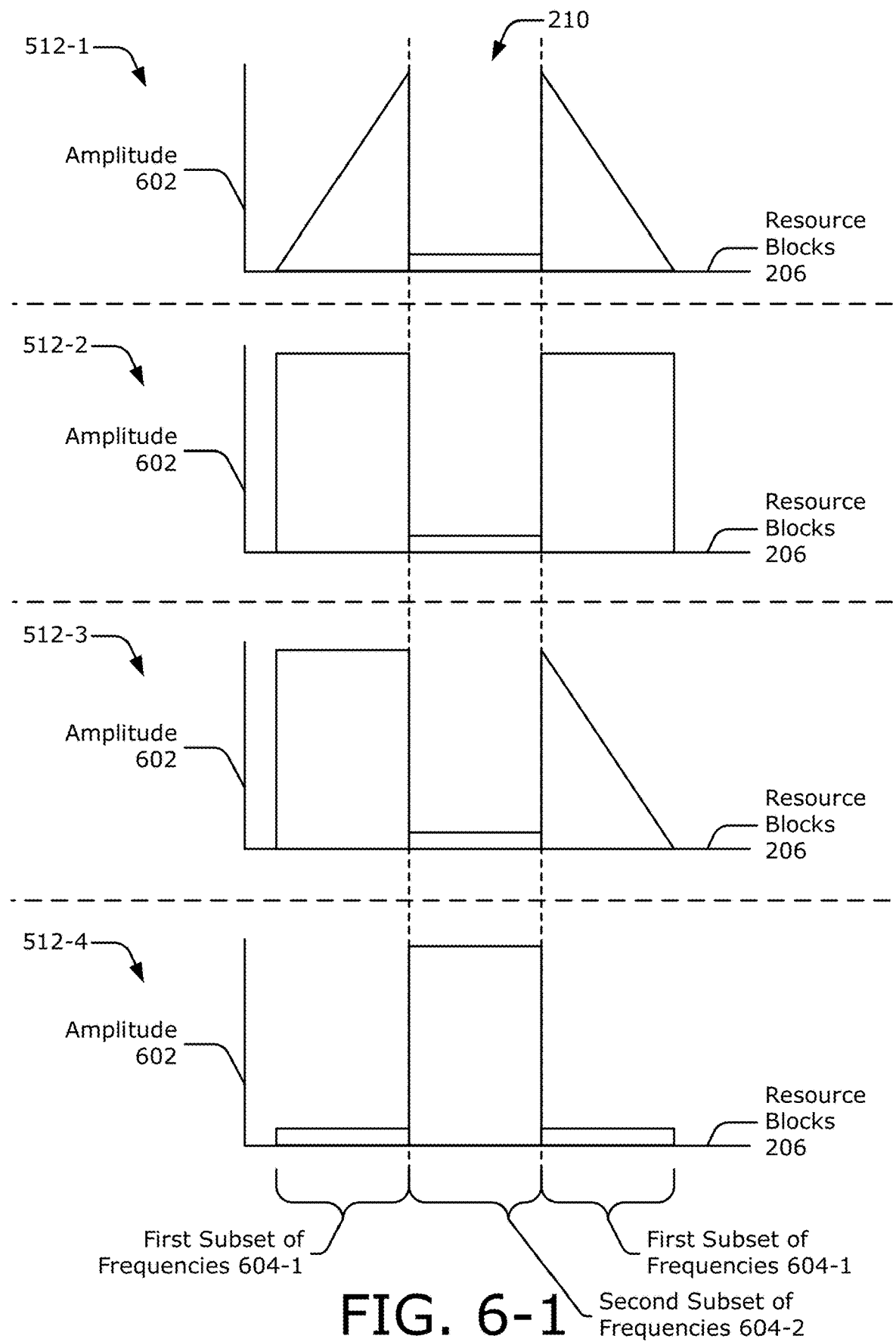
Figures 2, 6:
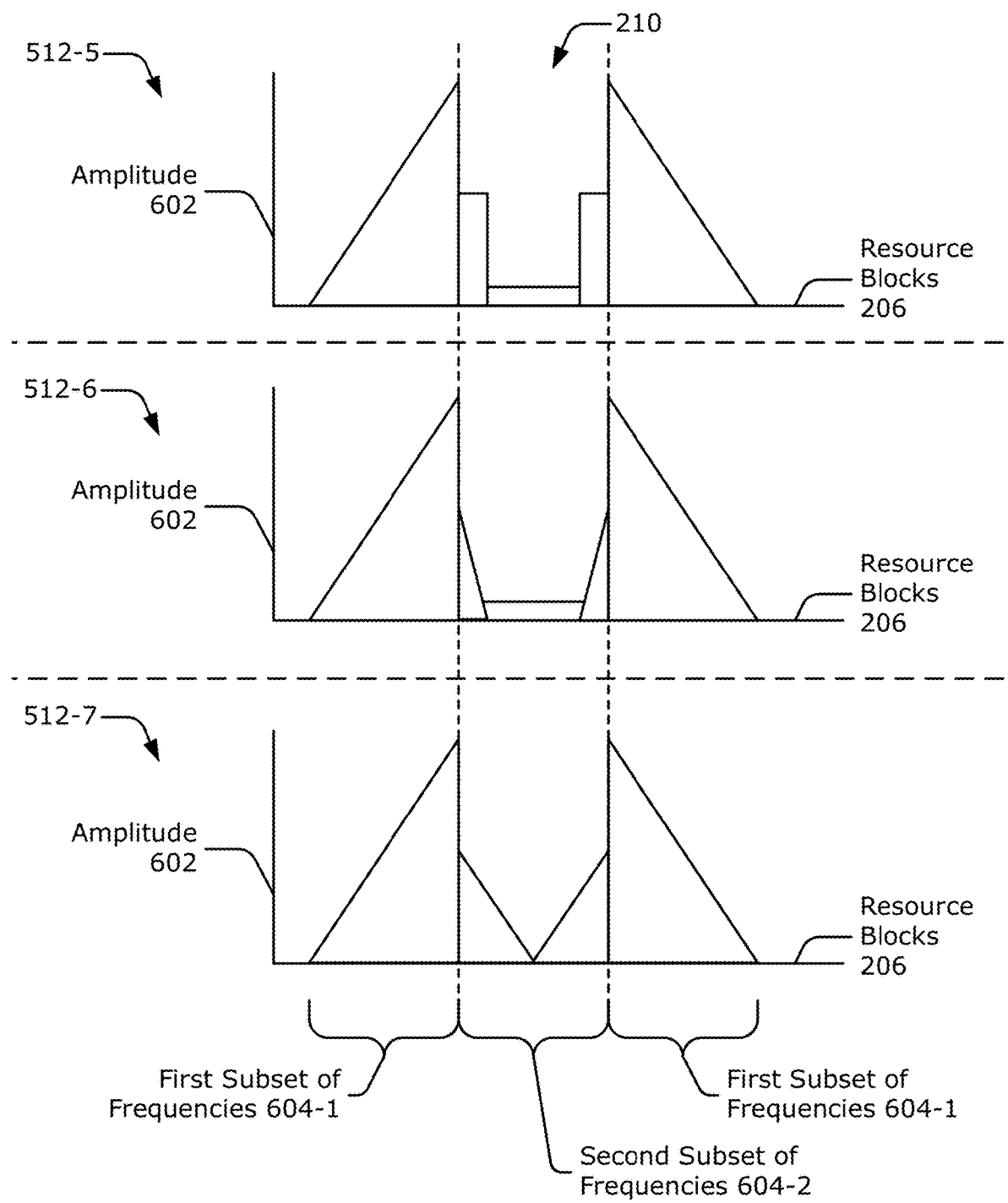

FIG. 6-1 illustrates example waveform-shaping functions 512-1 to 512-4 for frequency-based predistortion signal generation. To implement the techniques of frequency-selective waveform shaping 136, a shape of an amplitude 602 of the waveform-shaping function 512 (e.g., an envelope of the waveform-shaping function 512) varies across the frequency spectrum 200. For example, an amplitude 602 of the waveform-shaping function 512 can have a magnitude or shape within a first subset of frequencies 604-1 that differs from a second subset of frequencies 604-2. In general, a portion of the waveform-shaping function 512 with larger amplitudes 602 causes larger amounts of attenuation within the input signal 320 compared to other portions of the waveform-shaping function 512 with smaller amplitudes 602.

A bandwidth of the first subset of frequencies 604-1 can be similar or different to a bandwidth of the second subset of frequencies 604-2. The bandwidth of first subset of frequencies 604-1 or the second subset of frequencies 604-2 can be appropriately adjusted to satisfy a particular linearity specification.

In FIG. 6-1, the second subset of frequencies 604-2 includes frequencies within the allocated bandwidth 210. As such, the second subset of frequencies 604-2 represent the in-band frequencies 216. The first subset of frequencies 604-1 include frequencies that are adjacent to the second subset of frequencies 604-2. The first subset of frequencies 604-1 represent the out-of-band frequencies 218, which can be associated with the non-allocated resource blocks 214-1 to 214-B and/or the adjacent frequency band 204-1 or 204-2.

In the depicted waveform-shaping functions 512-1 to 512-4, the amplitudes 602 of the waveform-shaping functions 512-1 to 512-4 vary between the first and second subsets of frequencies 604-1 and 604-2. The waveform-shaping functions 512-1 to 512-3 have an average amplitude across the first subset of frequencies 604-1 that is substantially larger than an average amplitude across the second subset of frequencies 604-2. In this way, the waveform-shaping functions 512-1 to 512-3 enable the predistortion linearizer circuit 130 to selectively attenuate the non-linearities 128 within the first subset of frequencies 604-1 without significantly attenuating the non-linearities 128 within the second subset of frequencies 604-2 (or at least attenuating the non-linearities 128 within the second subset of frequencies 604-2 less than the attenuation of the non-linearities 128 within the first subset of frequencies 604-1). As an example, the attenuation of the non-linearities 128 within the first subset of frequencies 604-1 can be at least one decibel larger than the attenuation of the non-linearities 128 within the second subset of frequencies 604-2. The waveform-shaping functions 512-1 to 512-3 can be used to meet the in-band emissions target 222 and/or the adjacent channel leakage ratio target 224.

In many applications, it may be desirable to reduce all non-linearities 128 to the extent possible across frequencies both inside and close to the target operating frequency or allocated bandwidth 210. However, in this case, a certain level of non-linearities 128 are intentionally left in or maintained as they may be at a level that meets linearity specifications but also allows for efficient operation of the amplifier 126

The waveform-shaping function 512-1 has a triangular or ramp shape within the first subset of frequencies 604-1 and a rectangular shape within the second subset of frequencies 604-2. The waveform-shaping function 512-1 can be used, for instance, if the allocated resource blocks 212-1 to 212-A are in an inner portion of the frequency band 202, as shown in FIG. 2-4.

The waveform-shaping function 512-2 has a rectangular shape within the first subset of frequencies 604-1 and the second subset of frequencies 604-2. The waveform-shaping function 512-2 can be used, for instance, if the allocated resource blocks 212-1 to 212-A encompass the entire frequency band 202, as shown in FIG. 2-5.

The waveform-shaping function 512-3 has a rectangular shape within the first subset of frequencies 604-1 that are on a left side of the allocated bandwidth 210 and a triangular shape within the first subset of frequencies 604-1 that are on a right side of the allocated bandwidth 210. The waveform-shaping function 512-3 also has a rectangular shape within the second subset of frequencies 604-2. The waveform-shaping function 512-3 can be used, for instance, if the allocated resource blocks 212-1 to 212-A are at a left edge of the frequency band 202, as shown in FIG. 2-2.

Although not explicitly shown, another waveform-shaping function can be a mirrored version of the waveform-shaping function 512-3. In this case, the waveform-shaping function has a rectangular shape within the first subset of frequencies 604-1 that are on a right side of the allocated bandwidth 210 and a triangular shape within the first subset of frequencies 604-1 that are on a left side of the allocated bandwidth 210. The waveform-shaping function also has a rectangular shape within the second subset of frequencies 604-2. This waveform-shaping function can be used, for instance, if the allocated resource blocks 212-1 to 212-A are at a right edge of the frequency band 202, as shown in FIG. 2-3.

In contrast to the waveform-shaping functions 512-1 to 512-3, the waveform-shaping function 512-4 has an average amplitude across the second subset of frequencies 604-2 that is substantially larger than an average amplitude across the first subset of frequencies 604-1. In this way, the waveform-shaping function 512-4 enables the predistortion linearizer circuit 130 to selectively attenuate the non-linearities 128 within the second subset of frequencies 604-2 without significantly attenuating the non-linearities 128 within the first subset of frequencies 604-1. The waveform-shaping function 512-4 can be used to meet the error vector magnitude target 220. Other example waveform-shaping functions 512 are further described with respect to FIG. 6-2.

FIG. 6-2 illustrates other example waveform-shaping functions 512-5 to 512-7 for frequency-based predistortion signal generation. In the waveform-shaping functions 512-5 to 512-7, the shape of the amplitude 602 of the waveform-shaping function 512 further varies across a subset of the frequencies. For example, in the waveform-shaping functions 512-5 to 515-7, a portion of the second subset of frequencies 604-2 that is proximate to an edge of the allocated bandwidth 210 has higher amplitudes than another portion of the second subset of frequencies 604-2 that is proximate to a center of the allocated bandwidth 210. In this way, the predistortion linearizer circuit 130 can finely tune the attenuation of the non-linearities 128 within the allocated bandwidth 210 in a frequency-selective manner to further improve linearity performance. As such, the linearity specification can be met in situations in which the amplifier operates near saturation for improved efficiency.

Within the second subset of frequencies 604-2, the waveform-shaping function 512-5 has a first rectangular shape within frequencies that are proximate to the edges of the allocated bandwidth 210 and a second rectangular shape within frequencies that are in an inner portion of the allocated bandwidth 210. The waveform-shaping function 512-6 has a triangular shape within frequencies that are proximate to the edges of the allocated bandwidth 210 and a rectangular shape within frequencies that are in an inner portion of the allocated bandwidth 210. The waveform-shaping function 512-7 has a triangular shape on a left side and a right side of the allocated bandwidth 210.

While rectangular and ramp shapes are explicitly shown in FIGS. 6-1 and 6-2, the waveform-shaping function 512 can generally have any type of shape. Although not explicitly shown in FIG. 6-2, this concept can also be applied to the out-of-band frequencies 218. In particular, the shape of the waveform-shaping function 512 can vary between subsets of the out-of-band frequencies 218, as further described with respect to FIG. 7-1.

Figures 1, 7:
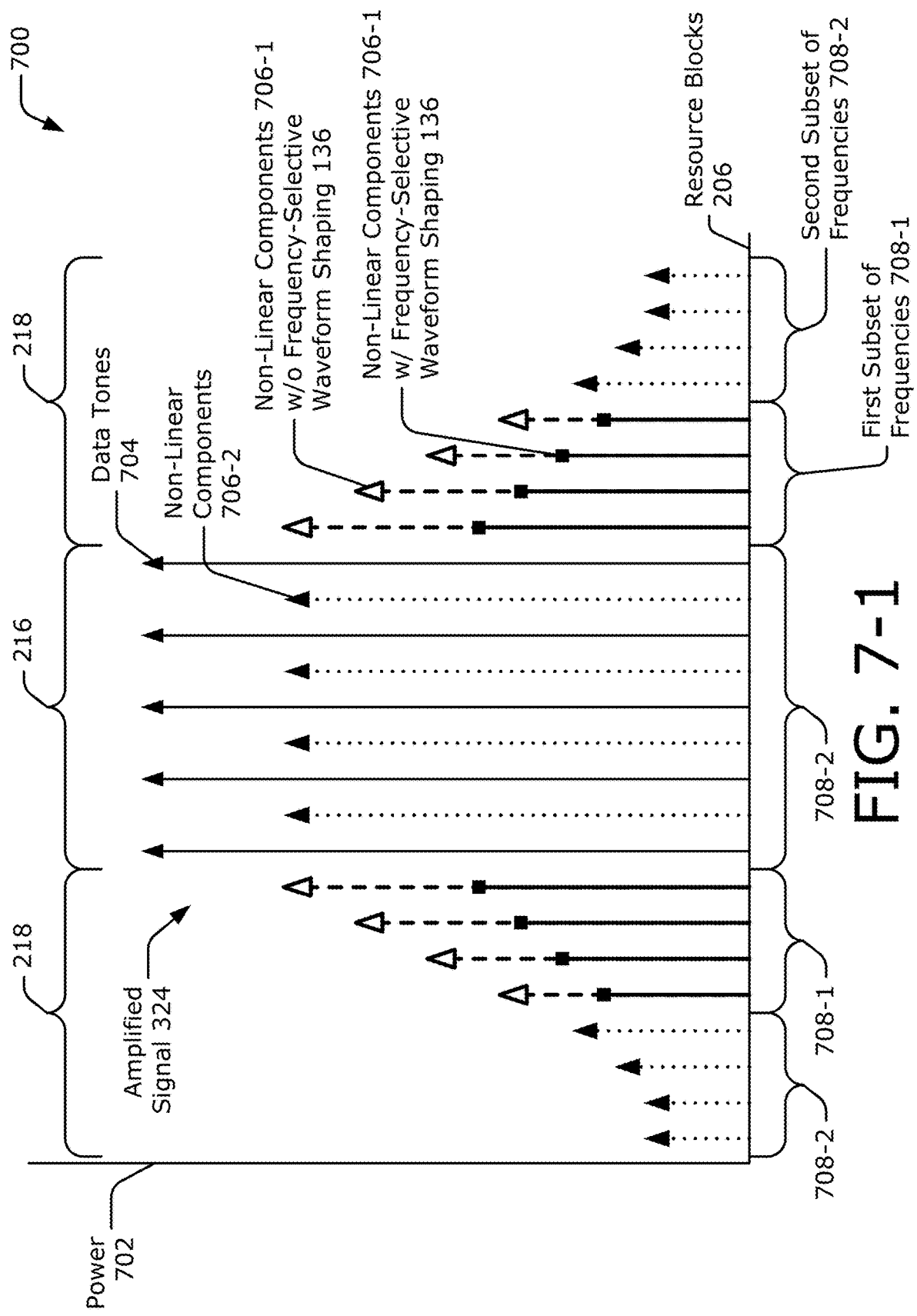
Figures 2, 7:
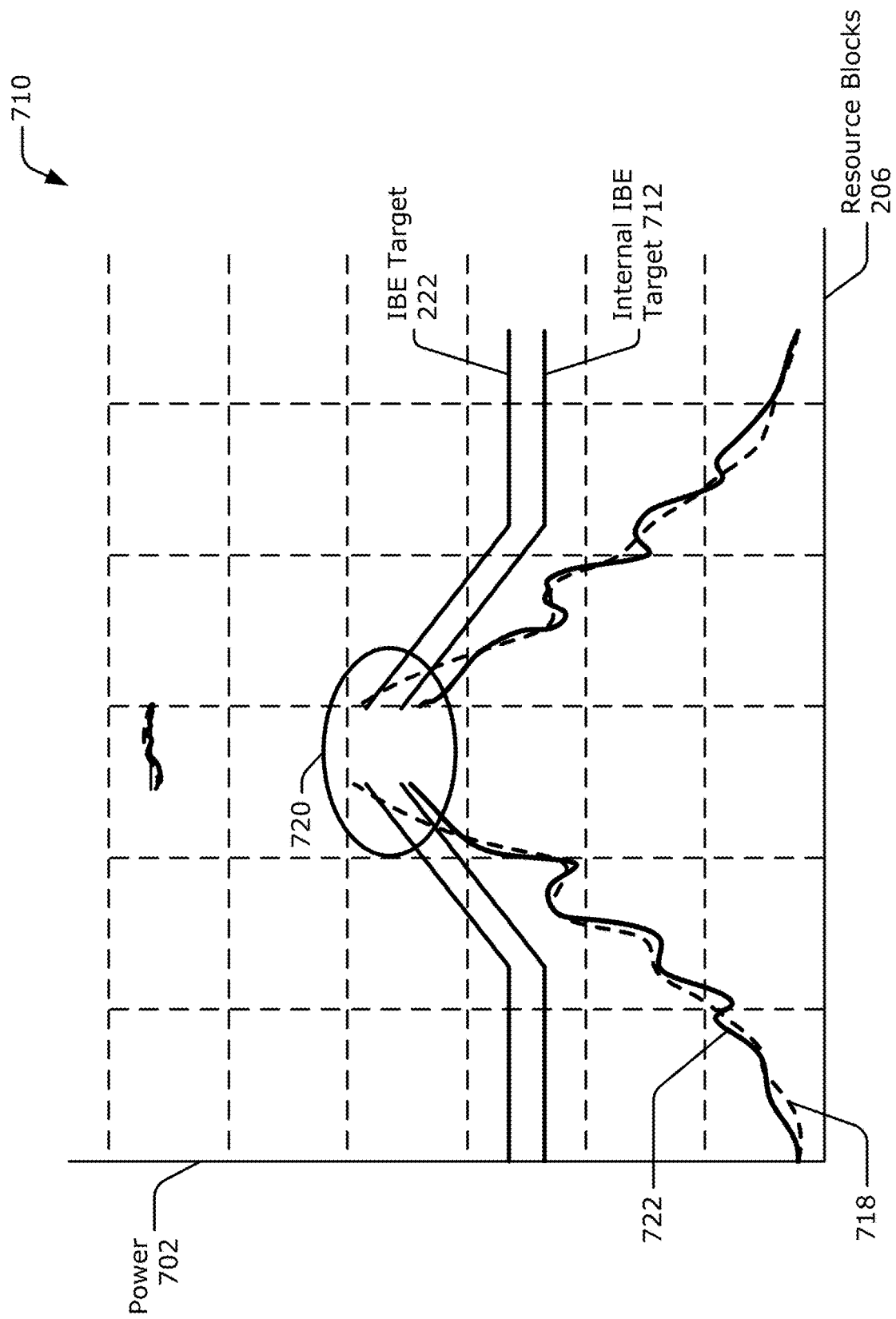

FIG. 7-1 illustrates example elements of the amplified signal 324. Graph 700 plots power 702 of the amplified signal 324 across the resource blocks 206, which includes resource blocks 206 associated with the frequency band 202 and other resource blocks 206 associated with the adjacent frequency bands 204-1 and 204-2. The resource blocks 206 can be mapped to the in-band frequencies 216 and the out-of-band frequencies 218.

The elements of the amplified signal 324 include data tones 704 and non-linear components 706-1 and 706-2. The non-linear components 706-1 and 706-2 can be generated by the non-linearities 128 associated with the amplifier 126. The data tones 704 exist within the in-band frequencies 216 and are represented by solid lines that are terminated by a solid arrowhead.

The non-linear components 706-1 and 706-2 are associated with different subsets of frequencies. The non-linear components 706-1 are associated with a first subset of frequencies 708-1 and are represented by dashed lines terminated by a closed (e.g., non-filled) arrowhead. The first subset of frequencies 708-1 includes out-of-band frequencies 218 that are adjacent to the in-band frequencies 216. The non-linear components 706-2 are associated with a second subset of frequencies 708-2 and are represented by dotted lines that are terminated by a solid arrowhead. The second subset of frequencies 708-2 includes the in-band frequencies 216 and out-of-band frequencies 218 that are not adjacent to the in-band frequencies 216. The first subset of frequencies 708-1 includes frequencies that differ from frequencies within the second subset of frequencies 708-2.

The first subset of frequencies 708-1 existing on the left side of the in-band frequencies 216 has a first bandwidth. Also, the first subset of frequencies 708-1 existing on the right side of the in-band frequencies 216 has a second bandwidth. In this example, the first bandwidth and the second bandwidth can be approximately equal. In other examples, the first bandwidth and the second bandwidth can differ. The first bandwidth and the second bandwidth can be greater than or less than the allocated bandwidth 210 associated with the in-band frequencies 216. In an example implementation, the first bandwidth and the second bandwidth are approximately 1.5 times larger than the allocated bandwidth 210.

Consider a situation in which frequency-selective waveform shaping 136 is not applied. Also, assume that the first subset of frequencies 708-1 includes frequencies associated with the non-allocated resource blocks 214-1 to 214-B. In this example situation, the non-linear components 706-1 of the amplified signal 324 cause the computing device 102 to violate the in-band emissions target 222 when the power amplifier is operated closer to saturation for higher efficiency.

To avoid violating the in-band emissions target 222, the predistortion linearizer circuit 130 performs frequency-selective waveform shaping 136 to attenuate the non-linear components 706-1 more than the non-linear components 706-2. In this example, the predistortion linearizer circuit 130 significantly attenuates the non-linear components 706-1 without substantially attenuating the non-linear components 706-2. The attenuated non-linear components 706-1 are represented by solid lines that are terminated by a solid square. By directly attenuating the non-linear components 706-1, the predistortion linearizer circuit 130 enables the in-band emissions target 222 to be met without significantly changing other characteristics of the amplified signal 324, such as the peak-to-average power ratio.

Other linearizers might be designed to attenuate non-linearities 128 in both the first and second frequency subsets 708-1 and 708-2 (e.g., the non-linear components 706-1 and 706-2). This would allow the in-band emissions target 222 to be met. However, the attenuation of the non-linearities 128 within the in-band frequencies 216 can cause undesirable expansion of the peak-to-average power ratio, which can degrade the efficiency of the amplifier 126. With the techniques of frequency-based predistortion signal generation, the non-linear components 706-2 can be attenuated less than the non-linear components 706-1. As such, expansion of the peak-to-average power ratio can be controlled in a manner that enables the amplifier 126 to operate near saturation. In an example implementation, the predistortion linearizer circuit 130 maintains amplitudes of the non-linear components 708-2 to be above a threshold to achieve a target peak-to-average power ratio. The performance differences between using and not using frequency-based predistortion signal generation are further described with respect to FIG. 7-2.

FIG. 7-2 illustrates an example graph 710 showing a performance comparison between techniques that utilize and do not utilize frequency-based predistortion signal generation. The graph 710 depicts the power 702 of the amplified signal 324 at an output of the amplifier 126 across the resource blocks 206. The graph 710 also shows the in-band emissions target 222. To provide additional margin for meeting the in-band emissions target 222, the operation of the wireless transceiver 120 can be tailored to satisfy an internal in-band emissions target 712, which represents a version of the in-band emissions target 222 with a built-in margin of at least a few decibels. By tailoring operation of the wireless transceiver 120 to meet the internal in-band emissions target 712 instead of the in-band emissions target 222 associated with a wireless communication specification, the wireless transceiver 120 has sufficient margin to satisfy the in-band emissions target 712 in the presence of changing temperatures, changing environmental conditions, and process variations.

Without applying frequency-selective waveform shaping 136, a power 718 of the amplified signal 324, as depicted by a dashed line in the graph 710, violates the internal in-band emissions target 712. For example, at 720, the power 718 of the amplified signal 324 at least exceeds the internal in-band emissions target 712. The power 718 of the amplified signal 324 can also exceed the in-band emissions target 222.

However, by applying frequency-selective waveform shaping 136, the amplified signal 324 has a different power 722, which is represented by a solid line in the graph 710. In this case, the power 722 of the amplified signal 324 remains below the internal in-band emissions target 712. As such, the computing device 102 meets the in-band emissions target 222.

FIG. 8 is a flow diagram illustrating an example process 800 for frequency-based predistortion signal generation. The process 800 is described in the form of a set of blocks 802-808 that specify operations that can be performed. However, operations are not necessarily limited to the order shown in FIG. 8 or described herein, for the operations may be implemented in alternative orders or in fully or partially overlapping manners. Also, more, fewer, and/or different operations may be implemented to perform the process 800, or an alternative process. Operations represented by the illustrated blocks of the process 800 may be performed by a computing device 102 (e.g., of FIG. 1) or a wireless transceiver 120 (e.g., of FIG. 1). More specifically, the operations of the process 800 may be performed by, at least in part, by a predistortion linearizer circuit 130 as shown in FIGS. 3-5.

At block 802, a compensation signal is generated, based on an input signal, to attenuate non-linearities existing within a first subset of frequencies more than other non-linearities existing within a second subset of frequencies. The non-linearities and the other non-linearities are associated with an amplifier. For example, the predistortion linearizer circuit 130 generates the compensation signal 520 based on the input signal 320. The input signal 320 can be a digital or analog baseband signal. In general, wireless transceiver 120 uses the input signal 320 to generate a radio-frequency signal for transmission. The compensation signal 520 is generated in a sub-band fashion 326 such that the shape of the amplitude of the compensation signal 520 can vary on a frequency basis.

The compensation signal 520 includes non-linear components, which are designed to attenuate non-linearities 128 existing within a first subset of frequencies more than other non-linearities 128 existing within a second subset of frequencies, as shown in FIGS. 6-1 to 7-1. In some cases, the non-linear components of the compensation signal 520 can attenuate the non-linearities 128 existing within the first subset of frequencies without substantially attenuating the non-linearities 128 existing within the second subset of frequencies. The non-linearities 128 are associated with the amplifier 126 (e.g., a power amplifier).

In an example aspect, the first subset of frequencies includes at least a portion of the out-of-band frequencies 218, and the second subset of frequencies includes at least a portion of the in-band frequencies 216. In another example aspect, the first subset of frequencies includes at least a portion of the in-band frequencies 216, and the second subset of frequencies includes at least a portion of the out-of-band frequencies 218.

At 804, a pre-distorted signal is generated based on the input signal and the compensation signal. For example, the predistortion linearizer circuit 130 generates the pre-distorted signal 322 based on the input signal 320 and the compensation signal 520, as shown in FIG. 5. By combining the input signal 320 with the compensation signal 520, the predistortion linearizer circuit 130 distorts the input signal 320 in such a way that at least some of the non-linearities 128 associated with the amplifier 126 will be neutralized on a frequency-selective basis.

At 806, the pre-distorted signal is passed to an input of the amplifier. For example, the predistortion linearizer circuit 130 directly or indirectly passes the pre-distorted signal 322 to the input of the amplifier 126, as shown in FIG. 3-2. In some implementations, the wireless transceiver 120 can further modify the pre-distorted signal 322 prior to the pre-distorted signal 322 being amplified by the amplifier 126. For example, the wireless transceiver 120 can upconvert the pre-distorted signal 322 from baseband frequencies to radio frequencies. The techniques for implementing frequency-based predistortion signal generation can compensate for non-linearities in amplifiers that operate near saturation and compensate for non-linearities in amplifiers that do not operate near saturation.

In some cases, the predistortion linearizer circuit 130 changes the shape of the compensation signal 520 (e.g., changes the waveform-shaping function 512) responsive to a change in the allocated resource blocks 212-1 to 212-A. For example, if the allocated resource blocks 212-1 to 212-A are at the left edge of the frequency band 202, as shown in FIG. 2-2, the predistortion linearizer circuit 130 can apply the waveform-shaping function 512-3 to generate the compensation signal 520 and meet at least the in-band emissions target 222 and the adjacent channel leakage ratio target 224. If the allocated resource blocks 212-1 to 212-A are at the right edge of the frequency band 202, as shown in FIG. 2-3, the predistortion linearizer circuit 130 can apply a mirrored version of the waveform-shaping function 512-3 to generate the compensation signal 520 and meet at least the in-band emissions target 222 and the adjacent channel leakage ratio target 224. If the allocated resource blocks 212-1 to 212-A are in an inner portion of the frequency band 202 (as shown in FIG. 2-4), the predistortion linearizer circuit 130 can apply the waveform-shaping function 512-1 to generate the compensation signal 520 and meet at least the in-band emissions target 222. If the allocated resource blocks 212-1 to 212-A encompass the entire frequency band 202, as shown in FIG. 2-5, the predistortion linearizer circuit 130 can apply the waveform-shaping function 512-2 to generate the compensation signal 520 and meet at least the adjacent channel leakage ratio target 224. In general, the techniques of frequency-based predistortion signal generation enable the predistortion linearizer circuit 130 to dynamically adjust the attenuation of the non-linearities 128 within the first subset of frequencies and the second subset of frequencies in order to satisfy one or more linearity specifications and at the same time increase the efficiency of power amplifier.

Some aspects are described below.

Aspect 1: An apparatus comprising:
   a predistortion linearizer circuit configured to:
     be coupled to an input of an amplifier, the amplifier having non-linearities associated with multiple frequencies, the multiple frequencies comprising a first subset of frequencies and a second subset of frequencies;
     accept an input signal;
     generate, based on the input signal, a compensation signal to attenuate the non-linearities existing within the first subset of frequencies more than the non-linearities existing within the second subset of frequencies; and
     generate a pre-distorted signal based on the input signal and the compensation signal.

Aspect 2: The apparatus of aspect 1, further comprising:
   the amplifier configured to amplify a version of the pre-distorted signal.

Aspect 3: The apparatus of aspect 1 or 2, wherein:
   the first subset of frequencies comprises frequencies that are above or below an allocated bandwidth associated with the input signal; and
   the second subset of frequencies comprises frequencies that are within the allocated bandwidth.

Aspect 4: The apparatus of aspect 3, wherein:
   the allocated bandwidth is associated with a set of allocated resource blocks within a frequency band; and
   the first subset of frequencies is associated with a set of non-allocated resource blocks within the frequency band.

Aspect 5: The apparatus of aspect 4, further comprising:
   a wireless transceiver, the wireless transceiver comprising the predistortion linearizer circuit and configured to satisfy, based on the compensation signal, at least one in-band emissions target associated with the first subset of frequencies.

Aspect 6: The apparatus of aspect 3, wherein:
   the allocated bandwidth is associated with a set of allocated resource blocks within a frequency band; and
   the first subset of frequencies is associated with another frequency band that is adjacent to the frequency band.

Aspect 7: The apparatus of aspect 6, further comprising:
   a wireless transceiver, the wireless transceiver comprising the predistortion linearizer circuit and configured to satisfy, based on the compensation signal, at least one adjacent channel leakage ratio target associated with the first subset of frequencies.

Aspect 8: The apparatus of any previous aspect, wherein the predistortion linearizer circuit is further configured to generate, based on the input signal, the compensation signal to attenuate the non-linearities existing within the first subset of frequencies without substantially attenuating the non-linearities existing within the second subset of frequencies.

Aspect 9: The apparatus of any previous aspect, wherein a shape of an amplitude of the compensation signal differs between the first subset of frequencies and the second subset of frequencies.

Aspect 10: The apparatus of aspect 9, wherein an average amplitude of the compensation signal is greater across the first subset of frequencies relative to the second subset of frequencies.

Aspect 11: The apparatus of aspect 9 or 10, wherein the shape of the amplitude of the compensation signal further varies within at least one of the following:
the first subset of frequencies; or
the second subset of frequencies.

Aspect 12: The apparatus of aspect 1 or 2, wherein:
the first subset of frequencies comprises frequencies that are within an allocated bandwidth associated with the input signal; and
the second subset of frequencies comprises frequencies that are above or below the allocated bandwidth.

Aspect 13: The apparatus of aspect 12, wherein:
the allocated bandwidth is associated with a set of allocated resource blocks within a frequency band; and
the second subset of frequencies is associated with at least one of the following:
a set of non-allocated resource blocks within the frequency band; or
another frequency band that is adjacent to the frequency band.

Aspect 14: The apparatus of aspect 13, further comprising:
a wireless transceiver, the wireless transceiver comprising the predistortion linearizer circuit and configured to satisfy, based on the compensation signal, at least one error vector magnitude target associated with the input signal.

Aspect 15: The apparatus of any previous aspect, wherein the predistortion linearizer circuit is configured to:
apply weights to the input signal to generate a weighted input signal; and
apply a waveform-shaping function to the weighted input signal to generate the compensation signal.

Aspect 16: The apparatus of aspect 15, wherein an amplitude of the waveform-shaping function differs between the first subset of frequencies and the second subset of frequencies.

Aspect 17: The apparatus of aspect 16, wherein an average amplitude of the waveform-shaping function is greater across the first subset of frequencies relative to the second subset of frequencies.

Aspect 18: The apparatus of any previous aspect, wherein the predistortion linearizer circuit is configured to:
accept another input signal;
generate, based on the other input signal, another compensation signal to attenuate the non-linearities existing within the second subset of frequencies more than the non-linearities existing within the first subset of frequencies; and
generate another pre-distorted signal based on the other input signal and the other compensation signal.

Aspect 19: The apparatus of any previous aspect, wherein:
the amplifier comprises a power amplifier; and
an operating point of the power amplifier is substantially proximate to a saturation point.

Aspect 20: The apparatus of aspect 19, wherein the operating point of the power amplifier is within approximately 7 decibels of the saturation point.

Aspect 21: The apparatus of any one of aspects 1 to 14, wherein the predistortion linearizer circuit comprises:
a weight estimation circuit configured to:
be coupled to the input of the amplifier and an output of the amplifier; and
generate weights that characterize the non-linearities of the amplifier; and
a waveform generation circuit configured to:
be coupled to the input of the amplifier;
accept the input signal;
apply the weights to the input signal to generate the compensation signal; and
generate the pre-distorted signal based on the compensation signal and the input signal.

Aspect 22: The apparatus of aspect 21, wherein the waveform generation circuit comprises:
a summation circuit coupled to the input of the amplifier, the summation circuit configured to combine the input signal with an inverse of the compensation signal to generate the pre-distorted signal;
a combiner circuit configured to generate a weighted input signal based on the input signal and the weights; and
a frequency-selective waveform shaper configured to:
perform a Fourier transform operation on the weighted input signal;
apply a waveform-shaping function to the transformed version of the weighted input signal; and
perform an inverse Fourier transform operation to generate the compensation signal.

Aspect 23: The apparatus of any previous aspect, wherein the predistortion linearizer circuit is configured to maintain amplitudes of the non-linearities within the second subset of frequencies to be above a threshold.

Aspect 24: An apparatus comprising:
means for amplifying a pre-distorted signal, the means having non-linearities associated with multiple frequencies, the multiple frequencies comprising a first subset of frequencies and a second subset of frequencies; and
means for attenuating the non-linearities existing within the first subset of frequencies more than the non-linearities existing within the second subset of frequencies to produce the pre-distorted signal.

Aspect 25: The apparatus of aspect 24, wherein the means for attenuating the non-linearities comprises means for generating a compensation signal having an amplitude with a shape that varies between the first subset of frequencies and the second subset of frequencies.

Aspect 26: The apparatus of aspect 24 or 25, wherein:
the first subset of frequencies comprises frequencies that are above or below an allocated bandwidth associated with an input signal; and
the second subset of frequencies comprises frequencies that are within the allocated bandwidth.

Aspect 27: The apparatus of aspect 24 or 25, wherein:
the first subset of frequencies comprises frequencies that are within an allocated bandwidth associated with an input signal; and
the second subset of frequencies comprises frequencies that are above or below the allocated bandwidth.

Aspect 28: A method for performing frequency-based predistortion signal generation, the method comprising:
generating, based on an input signal, a compensation signal to attenuate non-linearities existing within a first subset of frequencies more than other non-linearities existing within a second subset of frequencies, the non-linearities and the other non-linearities associated with an amplifier;
generating a pre-distorted signal based on the input signal and the compensation signal; and
passing the pre-distorted signal to an input of the amplifier.

Aspect 29: The method of aspect 28, wherein the generating of the compensation signal comprises generating, based on the input signal, the compensation signal to attenuate the non-linearities existing within the first subset of frequencies without substantially attenuating the non-linearities existing within the second subset of frequencies.

Aspect 30: The method of aspect 28 or 29, wherein a shape of an amplitude of the compensation signal differs between the first subset of frequencies and the second subset of frequencies.

Aspect 31: The method of any one of aspects 28 to 30, wherein:
the first subset of frequencies comprises frequencies that are above or below an allocated bandwidth associated with the input signal; and
the second subset of frequencies comprises frequencies that are within the allocated bandwidth.

Aspect 32: The method of any one of aspects 28 to 30, wherein:
the first subset of frequencies comprises frequencies that are within an allocated bandwidth associated with the input signal; and
the second subset of frequencies comprises frequencies that are above or below the allocated bandwidth.

Aspect 33: The method of any one of aspects 28 to 32, further comprising:
accepting another input signal;
generating, based on the other input signal, another compensation signal to attenuate the other non-linearities existing within the second subset of frequencies more than the non-linearities existing within the first subset of frequencies;
generating another pre-distorted signal based on the other input signal and the other compensation signal; and
passing the other pre-distorted signal to the input of the amplifier.

Aspect 34: An apparatus comprising:
a predistortion linearizer circuit operably coupled to an input of an amplifier, the amplifier having non-linearities associated with multiple frequencies, the multiple frequencies comprising a first subset of frequencies and a second subset of frequencies, the predistortion linearizer circuit configured to attenuate the non-linearities existing within out-of-band frequencies by a greater amount relative to the non-linearities existing within in-band frequencies.

Aspect 35: The apparatus of aspect 34, wherein:
the in-band frequencies comprise a set of allocated resource blocks within a frequency band; and
the out-of-band frequencies comprise at least one of the following:
a set of non-allocated resource blocks within the frequency band; or
frequencies associated with another frequency band that is adjacent to the frequency band.

Aspect 36: The apparatus of aspect 34 or 35, wherein the predistortion linearizer circuit is configured to attenuate the non-linearities within the out-of-band frequencies by a same amount.

Aspect 37: The apparatus of aspect 34 or 35, wherein the predistortion linearizer circuit is configured to attenuate the non-linearities within the out-of-band frequencies by different amounts such that a portion of the non-linearities within the out-of-band frequencies that are closer to the in-band frequencies are attenuated by a larger amount than another portion of the non-linearities within the out-of-band frequencies that are farther from the in-band frequencies.

Aspect 38: At least one computer-readable storage medium comprising computer-executable instructions that, responsive to execution by a processor, implement a pre-distortion linearizer circuit configured to:
generate, based on an input signal, a compensation signal having an amplitude with a shape that differs between a first subset of frequencies and a second subset of frequencies; and
generate a pre-distorted signal based on the input signal and the compensation signal.

Aspect 39: The computer-readable storage medium of aspect 38, wherein the compensation signal has an amplitude that varies within the first subset of frequencies.

Aspect 40: An apparatus comprising:
a radio-frequency front-end circuit configured to be coupled to an antenna, the radio-frequency front-end circuit comprising an amplifier configured to generate, based on a pre-distorted signal, an amplified signal having non-linearities within out-of-band frequencies attenuated by a greater amount than non-linearities within in-band frequencies; and
a predistortion linearizer circuit operably coupled to an input of the amplifier and configured to generate the pre-distorted signal.

Aspect 41: The apparatus of aspect 40, further comprising a modem operably coupled to the radio-frequency front-end circuit,
wherein the modem comprises the predistortion linearizer circuit.

Aspect 42: The apparatus of aspect 40, further comprising a transceiver circuit operably coupled to the radio-frequency front-end circuit,
wherein the transceiver circuit comprises the predistortion linearizer circuit.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a predistortion linearizer circuit configured to:
be coupled to an input of an amplifier, the amplifier having non-linearities associated with multiple frequencies, the multiple frequencies comprising a first subset of frequencies and a second subset of frequencies;
accept an input signal;
generate, based on the input signal, a compensation signal to attenuate the non-linearities existing within the first subset of frequencies more than the non-linearities existing within the second subset of frequencies; and generate a pre-distorted signal based on the input signal and the compensation signal, wherein the predistortion linearizer circuit is configured to:
apply weights to the input signal to generate a weighted input signal; and
apply a waveform-shaping function to the weighted input signal to generate the compensation signal.

2. The apparatus of claim 1, further comprising:
the amplifier configured to amplify a version of the pre-distorted signal.

3. The apparatus of claim 1, wherein:
the first subset of frequencies comprises frequencies that are above or below an allocated bandwidth associated with the input signal; and
the second subset of frequencies comprises frequencies that are within the allocated bandwidth.

4. The apparatus of claim 3, wherein:
the allocated bandwidth is associated with a set of allocated resource blocks within a frequency band; and
the first subset of frequencies is associated with a set of non-allocated resource blocks within the frequency band.

5. The apparatus of claim 4, further comprising:
a wireless transceiver, the wireless transceiver comprising the predistortion linearizer circuit and configured to satisfy, based on the compensation signal, at least one in-band emissions target associated with the first subset of frequencies.

6. The apparatus of claim 3, wherein:
the allocated bandwidth is associated with a set of allocated resource blocks within a frequency band; and
the first subset of frequencies is associated with another frequency band that is adjacent to the frequency band.

7. The apparatus of claim 6, further comprising:
a wireless transceiver, the wireless transceiver comprising the predistortion linearizer circuit and configured to satisfy, based on the compensation signal, at least one adjacent channel leakage ratio target associated with the first subset of frequencies.

8. The apparatus of claim 1, wherein the predistortion linearizer circuit is further configured to generate, based on the input signal, the compensation signal to attenuate the non-linearities existing within the first subset of frequencies without substantially attenuating the non-linearities existing within the second subset of frequencies.

9. The apparatus of claim 1, wherein a shape of an amplitude of the compensation signal differs between the first subset of frequencies and the second subset of frequencies.

10. The apparatus of claim 9, wherein an average amplitude of the compensation signal is greater across the first subset of frequencies relative to the second subset of frequencies.

11. The apparatus of claim 9, wherein the shape of the amplitude of the compensation signal further varies within at least one of the following:
the first subset of frequencies; or
the second subset of frequencies.

12. The apparatus of claim 1, wherein:
the first subset of frequencies comprises frequencies that are within an allocated bandwidth associated with the input signal; and
the second subset of frequencies comprises frequencies that are above or below the allocated bandwidth.

13. The apparatus of claim 12, wherein:
the allocated bandwidth is associated with a set of allocated resource blocks within a frequency band; and
the second subset of frequencies is associated with at least one of the following:
a set of non-allocated resource blocks within the frequency band; or
another frequency band that is adjacent to the frequency band.

14. The apparatus of claim 13, further comprising:
a wireless transceiver, the wireless transceiver comprising the predistortion linearizer circuit and configured to satisfy, based on the compensation signal, at least one error vector magnitude target associated with the input signal.

15. The apparatus of claim 1, wherein an amplitude of the waveform-shaping function differs between the first subset of frequencies and the second subset of frequencies.

16. The apparatus of claim 15, wherein an average amplitude of the waveform-shaping function is greater across the first subset of frequencies relative to the second subset of frequencies.

17. The apparatus of claim 1, wherein the predistortion linearizer circuit is configured to:
accept another input signal;
generate, based on the other input signal, another compensation signal to attenuate the non-linearities existing within the second subset of frequencies more than the non-linearities existing within the first subset of frequencies; and
generate another pre-distorted signal based on the other input signal and the other compensation signal.

18. The apparatus of claim 1, wherein:
the amplifier comprises a power amplifier; and
an operating point of the power amplifier is substantially proximate to a saturation point.

19. The apparatus of claim 18, wherein the operating point of the power amplifier is within approximately 7 decibels of the saturation point.

20. The apparatus of claim 1, wherein the predistortion linearizer circuit comprises:
a weight estimation circuit configured to:
be coupled to the input of the amplifier and an output of the amplifier; and
generate the weights that characterize the non-linearities of the amplifier; and
a waveform generation circuit configured to:
be coupled to the input of the amplifier;
accept the input signal;
apply the weights to the input signal to generate the compensation signal; and
generate the pre-distorted signal based on the compensation signal and the input signal.

21. The apparatus of claim 20, wherein the waveform generation circuit comprises:
a summation circuit coupled to the input of the amplifier, the summation circuit configured to combine the input signal with an inverse of the compensation signal to generate the pre-distorted signal;
a combiner circuit configured to generate the weighted input signal based on the input signal and the weights; and
a frequency-selective waveform shaper configured to:
perform a Fourier transform operation on the weighted input signal;
apply a waveform-shaping function to the transformed version of the weighted input signal; and
perform an inverse Fourier transform operation to generate the compensation signal.

22. The apparatus of claim 1, wherein the predistortion linearizer circuit is configured to maintain amplitudes of the non-linearities within the second subset of frequencies to be above a threshold.

23. An apparatus comprising:
means for amplifying a pre-distorted signal, the means having non-linearities associated with multiple frequencies, the multiple frequencies comprising in-band frequencies and out-of-band frequencies; and
means for attenuating the non-linearities existing within the in-band frequencies by a first amount and attenuating the non-linearities existing within the out-of-band frequencies by a second amount greater than the first amount.

24. The apparatus of claim 23, wherein the means for attenuating the non-linearities comprises means for generating a compensation signal having an amplitude with a shape that varies between the in-band frequencies and the out-of-band frequencies.

25. A method for performing frequency-based predistortion signal generation, the method comprising:
applying weights to an input signal to generate a weighted input signal;
apply a waveform-shaping function to the weighted input signal;
generating, based at least on the weighted input signal, a compensation signal to attenuate non-linearities existing within a first subset of frequencies more than other non-linearities existing within a second subset of frequencies, the non-linearities and the other non-linearities associated with an amplifier;
generating a pre-distorted signal based on the input signal and the compensation signal; and
passing the pre-distorted signal to an input of the amplifier.

26. The method of claim 25, wherein the generating of the compensation signal comprises generating, based on the input signal, the compensation signal to attenuate the non-linearities existing within the first subset of frequencies without substantially attenuating the non-linearities existing within the second subset of frequencies.

27. The method of claim 25, wherein a shape of an amplitude of the compensation signal differs between the first subset of frequencies and the second subset of frequencies.

28. The method of claim 25, wherein:
the first subset of frequencies comprises frequencies that are above or below an allocated bandwidth associated with the input signal; and
the second subset of frequencies comprises frequencies that are within the allocated bandwidth.

29. The method of claim 25, wherein:
the first subset of frequencies comprises frequencies that are within an allocated bandwidth associated with the input signal; and
the second subset of frequencies comprises frequencies that are above or below the allocated bandwidth.

30. The method of claim 25, further comprising:
accepting another input signal;
generating, based on the other input signal, another compensation signal to attenuate the other non-linearities existing within the second subset of frequencies more than the non-linearities existing within the first subset of frequencies;
generating another pre-distorted signal based on the other input signal and the other compensation signal; and
passing the other pre-distorted signal to the input of the amplifier.

31. An apparatus comprising:
a predistortion linearizer circuit operably coupled to an input of an amplifier, the amplifier having non-linearities associated with multiple frequencies, the multiple frequencies comprising in-band frequencies and out-of-band frequencies, the predistortion linearizer circuit configured to attenuate the non-linearities existing within the in-band frequencies by a first amount and attenuate the non-linearities existing within the out-of-band frequencies by a second amount greater than the first amount.

32. The apparatus of claim 31, wherein:
the in-band frequencies comprise a set of allocated resource blocks within a frequency band; and
the out-of-band frequencies comprise at least one of the following:
a set of non-allocated resource blocks within the frequency band; or
frequencies associated with another frequency band that is adjacent to the frequency band.

33. The apparatus of claim 31, wherein the predistortion linearizer circuit is configured to attenuate the non-linearities within the out-of-band frequencies by a same amount.

34. The apparatus of claim 31, wherein the predistortion linearizer circuit is configured to attenuate the non-linearities within the out-of-band frequencies by different amounts such that a portion of the non-linearities within the out-of-band frequencies that are closer to the in-band frequencies are attenuated by a larger amount than another portion of the non-linearities within the out-of-band frequencies that are farther from the in-band frequencies.

35. The apparatus of claim 31, wherein the first amount of attenuation and the second amount of attenuation are defined by a waveform-shaping function having an varying amplitude that differs between the in-band frequencies and the out-of-band frequencies.

36. The apparatus of claim 31, wherein the predistortion linearizer circuit is configured to attenuate the non-linearities within the in-band frequencies by different amounts such that a portion of the non-linearities within the in-band frequencies that are closer to the out-of-band frequencies are attenuated by a larger amount than another portion of the non-linearities within the in-band frequencies that are farther from the out-of-band frequencies.

37. An apparatus comprising:
a radio-frequency front-end circuit configured to be coupled to an antenna, the radio-frequency front-end circuit comprising an amplifier configured to generate, based on a pre-distorted signal, an amplified signal having non-linearities within in-band frequencies that are attenuated by a first amount and non-linearities within out-of-band frequencies that are attenuated by a second amount greater than the first amount; and
a predistortion linearizer circuit operably coupled to an input of the amplifier and configured to generate the pre-distorted signal.

38. The apparatus of claim 37, further comprising a modem operably coupled to the radio-frequency front-end circuit,
wherein the modem comprises the predistortion linearizer circuit.

39. The apparatus of claim 37, further comprising a transceiver circuit operably coupled to the radio-frequency front-end circuit, wherein the transceiver circuit comprises the predistortion linearizer circuit.

40. The apparatus of claim 37, wherein the first amount of attenuation and the second amount of attenuation are defined by a waveform-shaping function having an varying amplitude that differs between the in-band frequencies and the out-of-band frequencies.

41. An apparatus comprising:
a predistortion linearizer circuit configured to:
be coupled to an input of an amplifier, the amplifier having non-linearities associated with multiple frequencies, the multiple frequencies comprising a first subset of frequencies and a second subset of frequencies;
accept an input signal;
generate, based on the input signal, a compensation signal to attenuate the non-linearities existing within the first subset of frequencies more than the non-linearities existing within the second subset of frequencies; and
generate a pre-distorted signal based on the input signal and the compensation signal, wherein the predistortion linearizer circuit comprises:
a weight estimation circuit configured to:
be coupled to the input of the amplifier and an output of the amplifier; and
generate weights that characterize the non-linearities of the amplifier; and
a waveform generation circuit configured to:
be coupled to the input of the amplifier;
accept the input signal;
apply the weights to the input signal to generate the compensation signal; and
generate the pre-distorted signal based on the compensation signal and the input signal.

42. The apparatus of claim 41, wherein the waveform generation circuit comprises:
a summation circuit coupled to the input of the amplifier, the summation circuit configured to combine the input signal with an inverse of the compensation signal to generate the pre-distorted signal;
a combiner circuit configured to generate a weighted input signal based on the input signal and the weights; and
a frequency-selective waveform shaper configured to:
perform a Fourier transform operation on the weighted input signal;
apply a waveform-shaping function to the transformed version of the weighted input signal; and
perform an inverse Fourier transform operation to generate the compensation signal.

* * * * *